United States Patent
Raring et al.

(10) Patent No.: US 8,124,996 B2
(45) Date of Patent: Feb. 28, 2012

(54) WHITE LIGHT DEVICES USING NON-POLAR OR SEMIPOLAR GALLIUM CONTAINING MATERIALS AND PHOSPHORS

(75) Inventors: James W. Raring, Goleta, CA (US); Eric M. Hall, Goleta, CA (US); Mark P. D'Evelyn, Goleta, CA (US)

(73) Assignee: Soraa, Inc., Goleta, CA (US)

( * ) Notice: Subject to any disclaimer, the term of this patent is extended or adjusted under 35 U.S.C. 154(b) by 52 days.

(21) Appl. No.: 12/534,829

(22) Filed: Aug. 3, 2009

(65) Prior Publication Data

US 2010/0025656 A1    Feb. 4, 2010

Related U.S. Application Data

(60) Provisional application No. 61/086,139, filed on Aug. 4, 2008.

(51) Int. Cl.
*H01L 33/00* (2010.01)

(52) U.S. Cl. . 257/98; 257/13; 257/E33.06; 257/E33.061

(58) Field of Classification Search .............. 257/13, 257/98, E33.06, E33.061
See application file for complete search history.

(56) References Cited

U.S. PATENT DOCUMENTS

| | | |
|---|---|---|
| 3,245,760 A | 4/1966 | Sawyer |
| 3,303,053 A | 2/1967 | Strong et al. |
| 3,335,084 A | 8/1967 | Hall |
| 4,030,966 A | 6/1977 | Hornig et al. |
| 4,430,051 A | 2/1984 | Von Platen |
| 5,868,837 A | 2/1999 | DiSalvo et al. |
| 6,090,202 A | 7/2000 | Klipov |
| 6,129,900 A | 10/2000 | Satoh et al. |
| 6,152,977 A | 11/2000 | D'Evelyn |
| 6,350,191 B1 | 2/2002 | D'Evelyn et al. |
| 6,372,002 B1 | 4/2002 | D'Evelyn et al. |

(Continued)

FOREIGN PATENT DOCUMENTS

JP    2005-289797 A2    10/2005

(Continued)

OTHER PUBLICATIONS

Byrappa et al., "Handbook of Hydrothermal Technology: A Technology for Crystal Growth and Materials Processing," Noyes Publications, Park Ridge, New Jersey, 2001, pp. 94-96 and 152.

(Continued)

*Primary Examiner* — Victor A Mandala

(57) ABSTRACT

A packaged light emitting device. The device includes a substrate member comprising a surface region and one or more light emitting diode devices overlying the surface region. In a specific embodiment, at least one of the light emitting diode device is fabricated on a semipolar or nonpolar GaN containing substrate. The one or more light emitting diode devices are fabricated on the semipolar or nonpolar GaN containing substrate emits substantially polarized emission of one or more first wavelengths. At least at least one of the light emitting diode devices comprise a quantum well region, which is characterized by an electron wave function and a hole wave function. In a specific embodiment, the electron wave function and the hole wave function are substantially overlapped within a predetermined spatial region of the quantum well region. In a specific embodiment, the device has a thickness of one or more entities formed overlying the one or more light emitting diode devices. The one or more entities are excited by the substantially polarized emission and emitting electromagnetic radiation of one or more second wavelengths.

19 Claims, 6 Drawing Sheets

U.S. PATENT DOCUMENTS

| | | |
|---|---|---|
| 6,398,867 B1 | 6/2002 | D'Evelyn et al. |
| 6,406,776 B1 | 6/2002 | D'Evelyn |
| 6,455,877 B1 | 9/2002 | Ogawa et al. |
| 6,475,254 B1 | 11/2002 | Saak et al. |
| 6,541,115 B2 | 4/2003 | Pender et al. |
| 6,596,040 B2 | 7/2003 | Saak et al. |
| 6,596,079 B1 | 7/2003 | Vaudo et al. |
| 6,635,904 B2 * | 10/2003 | Goetz et al. ............... 257/103 |
| 6,639,925 B2 | 10/2003 | Niwa et al. |
| 6,656,615 B2 | 12/2003 | Dwilinski et al. |
| 6,765,240 B2 | 7/2004 | Tischler et al. |
| 6,806,508 B2 | 10/2004 | D'Evelyn et al. |
| 6,858,882 B2 | 2/2005 | Tsuda et al. |
| 6,861,130 B2 | 3/2005 | D'Evelyn et al. |
| 6,936,488 B2 | 8/2005 | D'Evelyn et al. |
| 6,955,719 B2 | 10/2005 | Dmitriev et al. |
| 7,009,215 B2 | 3/2006 | D'Evelyn et al. |
| 7,026,755 B2 | 4/2006 | Setlur et al. |
| 7,033,858 B2 * | 4/2006 | Chai et al. ............... 438/106 |
| 7,053,413 B2 | 5/2006 | D'Evelyn et al. |
| 7,063,741 B2 | 6/2006 | D'Evelyn et al. |
| 7,067,407 B2 | 6/2006 | Kostamo et al. |
| 7,078,731 B2 | 7/2006 | D'Evelyn et al. |
| 7,098,487 B2 | 8/2006 | D'Evelyn et al. |
| 7,101,433 B2 | 9/2006 | D'Evelyn et al. |
| 7,102,158 B2 | 9/2006 | Tysoe et al. |
| 7,105,865 B2 | 9/2006 | Nakahata et al. |
| 7,122,827 B2 | 10/2006 | Alizadeh et al. |
| 7,125,453 B2 | 10/2006 | D'Evelyn et al. |
| 7,160,388 B2 | 1/2007 | Dwilinski et al. |
| 7,160,531 B1 | 1/2007 | Jacques et al. |
| 7,175,704 B2 | 2/2007 | D'Evelyn et al. |
| 7,208,393 B2 | 4/2007 | Haskell et al. |
| 7,220,658 B2 | 5/2007 | Haskell et al. |
| 7,291,544 B2 | 11/2007 | D'Evelyn et al. |
| 7,316,746 B2 | 1/2008 | D'Evelyn et al. |
| 7,329,371 B2 | 2/2008 | Setlur et al. |
| 7,335,262 B2 | 2/2008 | Dwilinski et al. |
| 7,338,828 B2 | 3/2008 | Imer et al. |
| 7,358,542 B2 | 4/2008 | Radkov et al. |
| 7,364,619 B2 | 4/2008 | Dwilinski et al. |
| 7,368,015 B2 | 5/2008 | D'Evelyn et al. |
| 7,381,391 B2 | 6/2008 | Spencer et al. |
| 7,572,425 B2 | 8/2009 | McNulty et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 2001/0011935 A1 | 8/2001 | Lee et al. |
| 2001/0048114 A1 | 12/2001 | Morita et al. |
| 2002/0105986 A1 | 8/2002 | Yamasaki |
| 2002/0171092 A1 * | 11/2002 | Goetz et al. ............... 257/103 |
| 2003/0027014 A1 | 2/2003 | Johnson et al. |
| 2003/0140845 A1 | 7/2003 | D'Evelyn et al. |
| 2003/0145784 A1 | 8/2003 | Thompson et al. |
| 2003/0183155 A1 | 10/2003 | D'Evelyn et al. |
| 2004/0000266 A1 | 1/2004 | D'Evelyn et al. |
| 2004/0104391 A1 | 6/2004 | Maeda et al. |
| 2004/0222357 A1 | 11/2004 | King et al. |
| 2005/0098095 A1 | 5/2005 | D'Evelyn et al. |
| 2005/0109240 A1 | 5/2005 | Maeta et al. |
| 2005/0191773 A1 | 9/2005 | Suzuki et al. |
| 2005/0205215 A1 | 9/2005 | Giddings et al. |
| 2005/0285128 A1 * | 12/2005 | Scherer et al. ............ 257/98 |
| 2006/0030738 A1 | 2/2006 | Vanmaele et al. |
| 2006/0037529 A1 | 2/2006 | D'Evelyn et al. |
| 2006/0038193 A1 | 2/2006 | Wu et al. |
| 2006/0048699 A1 | 3/2006 | D'Evelyn et al. |
| 2006/0096521 A1 | 5/2006 | D'Evelyn et al. |
| 2006/0175624 A1 * | 8/2006 | Sharma et al. ............. 257/94 |
| 2006/0177362 A1 | 8/2006 | D'Evelyn et al. |
| 2006/0207497 A1 | 9/2006 | D'Evelyn et al. |
| 2006/0213429 A1 | 9/2006 | Motoki et al. |
| 2006/0228870 A1 | 10/2006 | Oshima |
| 2006/0246687 A1 | 11/2006 | Kaiser et al. |
| 2006/0289386 A1 | 12/2006 | Tysoe et al. |
| 2007/0015345 A1 | 1/2007 | Baker et al. |
| 2007/0077674 A1 | 4/2007 | Okuyama et al. |
| 2007/0086916 A1 * | 4/2007 | LeBoeuf et al. ............ 422/58 |
| 2007/0120141 A1 * | 5/2007 | Moustakas et al. ........ 257/103 |
| 2007/0141819 A1 | 6/2007 | Park |
| 2007/0142204 A1 | 6/2007 | Park et al. |
| 2007/0151509 A1 | 7/2007 | Park |
| 2007/0158785 A1 | 7/2007 | D'Evelyn et al. |
| 2007/0164292 A1 | 7/2007 | Okuyama |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0190758 A1 | 8/2007 | Kaeding et al. |
| 2007/0197004 A1 | 8/2007 | Dadgar et al. |
| 2007/0210074 A1 | 9/2007 | Maurer et al. |
| 2007/0234946 A1 | 10/2007 | Hashimoto et al. |
| 2007/0252164 A1 | 11/2007 | Zhong et al. |
| 2008/0008855 A1 | 1/2008 | D'Evelyn et al. |
| 2008/0083741 A1 | 4/2008 | Giddings et al. |
| 2008/0087919 A1 | 4/2008 | Tysoe et al. |
| 2008/0149949 A1 * | 6/2008 | Nakamura et al. ......... 257/89 |
| 2008/0149959 A1 * | 6/2008 | Nakamura et al. ......... 257/98 |
| 2008/0156254 A1 | 7/2008 | Dwilinski et al. |
| 2008/0193363 A1 | 8/2008 | Tsuji |
| 2008/0272462 A1 | 11/2008 | Shimamoto |
| 2008/0285609 A1 | 11/2008 | Ohta et al. |
| 2009/0301387 A1 | 12/2009 | D'Evelyn |
| 2009/0301388 A1 | 12/2009 | D'Evelyn |
| 2009/0320744 A1 | 12/2009 | D'Evelyn et al. |
| 2009/0320745 A1 | 12/2009 | D'Evelyn et al. |
| 2010/0001300 A1 | 1/2010 | Raring et al. |
| 2010/0003492 A1 | 1/2010 | D'Evelyn et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031876 A1 | 2/2010 | D'Evelyn |
| 2010/0044718 A1 * | 2/2010 | Hanser et al. ............... 257/76 |
| 2010/1003187 | 2/2010 | D'Evelyn |
| 2010/0104495 A1 * | 4/2010 | Kawabata et al. ......... 423/409 |
| 2010/0147210 A1 | 6/2010 | D'Evelyn |
| 2010/0151194 A1 | 6/2010 | D'Evelyn |
| 2010/0219505 A1 | 9/2010 | D'Evelyn |
| 2010/0295088 A1 | 11/2010 | D'Evelyn et al. |
| 2010/0327291 A1 * | 12/2010 | Preble et al. ............... 257/76 |

FOREIGN PATENT DOCUMENTS

| | | |
|---|---|---|
| JP | 2007-039321 A | 2/2007 |
| WO | WO 2005121415 A1 | 12/2005 |

OTHER PUBLICATIONS

Callahan et al., "Synthesis and Growth of Gallium Nitride by the Chemical Vapor Reaction Process (CVRP)," 1999, MRS Internet Journal Nitride Semiconductor Research, vol. 4, Issue No. 10, pp. 1-6.

D'Evelyn et al., "Bulk GaN Crystal Growth by the High-Pressure Ammonothermal Method," Journal of Crystal Growth, 2007, vol. 300, pp. 11-16.

Dwiliński et al, AMMONO Method of BN, AlN, and GaN Synthesis and Crystal Growth,: Journal of Nitride Semiconductor Research, 1998, 3,25, MRS, Internet: http://nsr.mij.mrs.org.

Dwilinski et al., "Excellent Crystallinity of Truly Bulk Ammonothermal GaN," Journal of Crystal Growth, 2008, vol. 310, pp. 3911-3916.

Ehrentraut et al., "Prospects for the Ammonothermal Growth of Large GaN Crystal," Journal of Crystal Growth, 2007, vol. 305, pp. 304-310.

Farrell et al., "Continuous-wave Operation of ALGaN-cladding-free Nonpolar m-Plane InGaN/GaN Laser diodes," 2007, Japanese Journal of Applied Physics, vol. 46, No. 32, pp. L761-L763.

Frayssinet et al., "Evidence of Free Carrier Concentration Gradient Along the c-axis for Undoped GaN Single Crystals," Journal of Crystal Growth, 2001, vol. 230, pp. 442-447.

Kojima et al., "Stimulated Emission at 474 nm from an InGaN Laser Diode Structure Grown on a (1122) GaN Substrate ," 2007, Applied Physics Letter, vol. 91, No. 25, pp. 251107-251107-3.

Kolis et al., "Crystal Growth of Gallium Nitride in Supercritical Ammonia," Journal of Crystal Growth, 2001, vol. 222, pp. 431-434.

Kolis et al., "Materials Chemistry and Bulk Crystal Growth of Group III Nitrides in Supercritical Ammonia" Mat. Res. Soc. Symp. Proc., 1998, vol. 495, pp. 367-372.

Kubota et al., "Temperature Dependence of Polarized Photoluminescence from Nonpolar m-plane InGaN Multiple Quantum Wells for Blue Laser Diodes" 2008, Applied Physics Letter, vol. 92, pp. 011920-011920-3.

Mirwald et al., "Low-Friction Cell for Piston-Cylinder High Pressure Apparatus," Journal of Geophysical Research, 1975, vol. 80, No. 11, pp. 1519-1525.

Motoki et al. "Growth and Characterization of Freestanding GaN Substrates," Journal of Crystal Growth, 2002, vol. 237-239, pp. 912-921.

Murota et al., "Solid State Light Source Fabricated with YAG:Ce Single Crystal," 2002, Japanese Journal of Applied Physics, vol. 46, No. 41, Part 2, No. 8A, pp. L887-L888.

Okamoto et al., "Continuous-Wave Operation of m-Plane InGaN Multiple Quantum Well Laser Diodes," 2007, Japanese Journal of Applied Physics, vol. 46, No. 9, pp. L187-L189.

Okamoto et al., "Pure Blue Laser Diodes Based on Nonpolar m-Plane Gallium Nitride with InGaN Waveguiding Layers," 2007, Japanese Journal of Applied Physics, vol. 46, No. 35, pp. L820- L822.

Oshima et al., "Thermal and Optical Properties of Bulk GaN Crystals Fabricated Through Hydride Vapor Phase Epitaxy with Void-Assisted Separation," 2005, Journal of Applied Physics, vol. 98, pp. 103509-1-103509-3.

Peters, "Ammonothermal Synthesis of Aluminium Nitride," Journal of Crystal Growth, 1999, vol. 4, pp. 411-418.

Schmidt et al., "Demonstration of Nonpolar m-Plane InGaN/GaN Laser Diodes," 2007, Japanese Journal of Applied Physics, vol. 46, No. 9, L190-L191.

Sizov et al., "500-nm Optical Gain Anisotropy of Semipolar (1122) InGaN Quantum Wells," 2009, Applied Physics Express, vol. 2, pp. 071001-1-071001-3.

Tsuda et al., "Blue Laser Diodes Fabricated on $m$-Plane GaN Substrates," 2008, Applied Physics Express, vol. 1, pp. 011104-011104-03.

Tyagi et al., "Semipolar (1011) InGaN/GaN Laser Diodes on Bulk GaN Substrates," 2007, Japanese Journal of Applied Physics, vol. 46, No. 19, pp. L444-L445.

Wang et al., "Ammonothermal Synthesis of III-Nitride Crystals," Crystal Growth & Design, 2006, vol. 6, Issue No. 6, pp. 1227-1246.

Wang et al., "Synthesis of Dense Polycrystaline GaN of High Purity by the Chemical Vapor Reaction Process," Journal of Crystal Growth, 2006, vol. 286, pp. 50-54.

Zhong et al., "Demonstration of High Power Blue-Green Light Emitting Diode on Semipolar (1122) Bulk GaN Substrate," 2007, Electron Letter, vol. 43, No. 15, pp. 825-826.

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kim et al, "Improved Electroluminescence on Nonpolar m-plane InGaN/GaN Qantum Well LEDs", 2007, Physica Status Solidi (RRL), vol. 1, No. 3, pp. 125-127.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Sato et al., "High Power and High Efficiency Green Light Emitting Diode on free-Standing Semipolar (1122) Bulk GaN Substrate," 2007.Physica Status Solidi (RRL), vol. 1, pp. 162-164.

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

International Search Report of PCT Application No. PCT/US09/52611, dated Sep. 29, 2009, 14 pages total.

Hashimoto et al. "Ammonothermal growth of bulk GaN," Journal of Crystal Growth 310:3907-3910 (Aug. 2008).

Hashimoto et al. "A GaN bulk crystal wit improved structural quality grown by the ammonothermal method," Nature Materials 6:568-671 (Jul. 2007).

Sarva, et al. "Dynamic compressive strength of silicon carbide under uniaxial compression," Mat. Sci. & Eng. A 317,140 (2001).

Wang et al. "Ammonothermal growth of GaN crystals in alkaline solutions," Journal of crystal Growth 287:376-380 (Jan. 2006).

Chiang et al. "Luminescent Properties of Cerium-Activated Garnet Series Phosphor: Structure and Temperature Effects," Journal of the Electrochemical Society 155:B517-B520 (2008).

Chiu et al. "Synthesis and Luminescence Properties of Intensely Red-Emitting M5Eu $(WO_4)_{4-x}(MoO_4)x$ (M= Li, Na, K) Phosphors," Journal of the Electrochemical Society 15:J71-J78 (2008).

Cl et al. "$Ca_{1-x}Mo_{1-y}Nb_yO_4:Eu_x^{3+}$: A novel red phosphor for white light emitting diodes," Journal of Physics 152:670-674 (2008).

Happek "Development of Efficient UV-LED Phosphor Coatings for Energy Saving Solid State Lighting" University of Georgia (Jan. 2007).

Höppe et al. "Luminescence in $Eu^{2+}$-doped $Ba_2Si_5N_8$: fluorescence, thernoliminescence, and upconversion"; Journal of Physics and Chemistry of Solids 61:2001-2006 (2000).

Li et al. "The effect of replacement of Sr by Ca on the structural and luminescence properties of the red-emitting $Sr_2Si_5N_8:Eu_{2+}$ Led conversion phosphor," Journal of Solid State Chemistry 181:515-524 (2008).

Mueller-Mach et al. "Highly efficient all-nitride phosphor-converted white light emitting diode," Physics Status Solidi (a) 202:1727-1732 (Jul. 2005).

Setlur et al. "Crystal chemistry and luminescence of $Ce^{3+}$-doped $(Lu_2CaMg_2)$-Ca-2(Si, Ge)$_3O_{12}$ and its use in LED based lighting," Chemistry of Materials 18: 3314-3322 (2006).

Wang et al. "New red $Y_{0.85}Bi_{0.1}Eu_{0.05}V_{1-y}M_yO_4$(M=Nb, P) phosphors for light-emitting diodes," Physica B: Condensed Matter 403:2071-2075 (Jun. 2008).

Yamamoto "White LED phosphors: the next step," Proceeding of . SPIE (2010).

Yang et al. "Preparation and luminescence properties of LED conversion novel phosphors $SrZnO_2$:Sm," Materials Letters 62:907-910 (Mar. 2008).

* cited by examiner

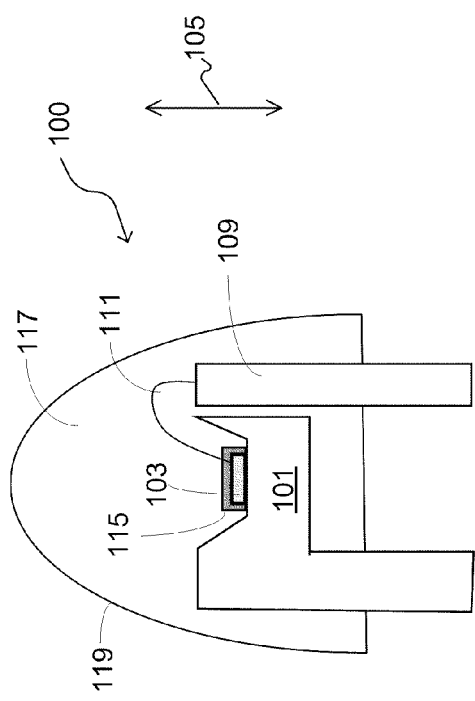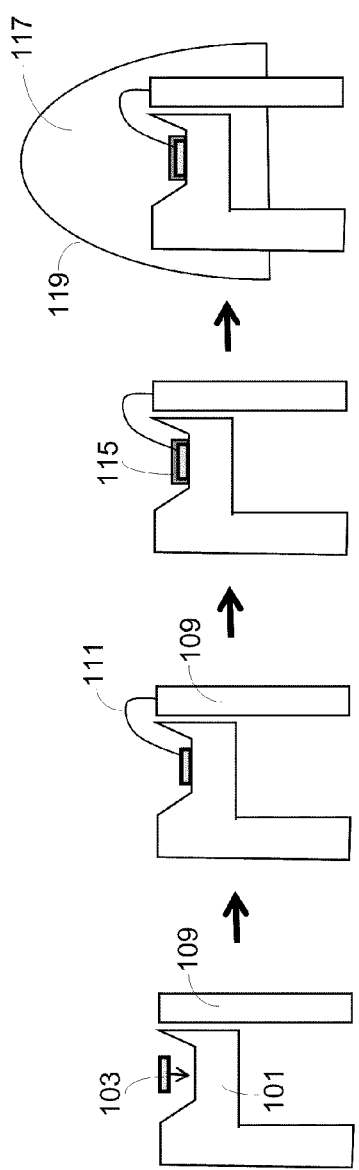

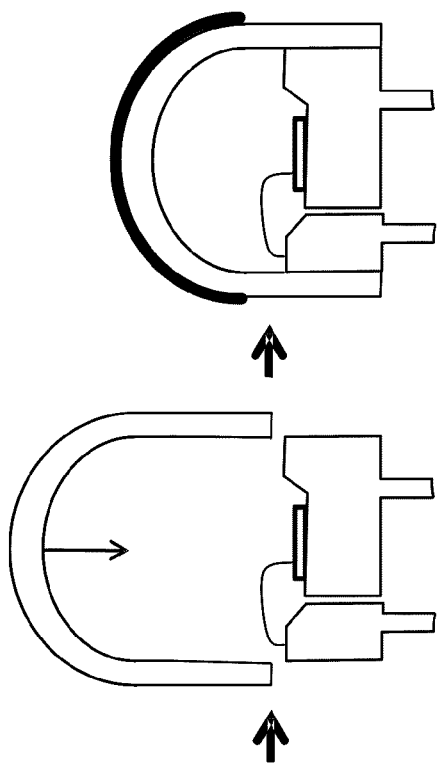
Figure 11
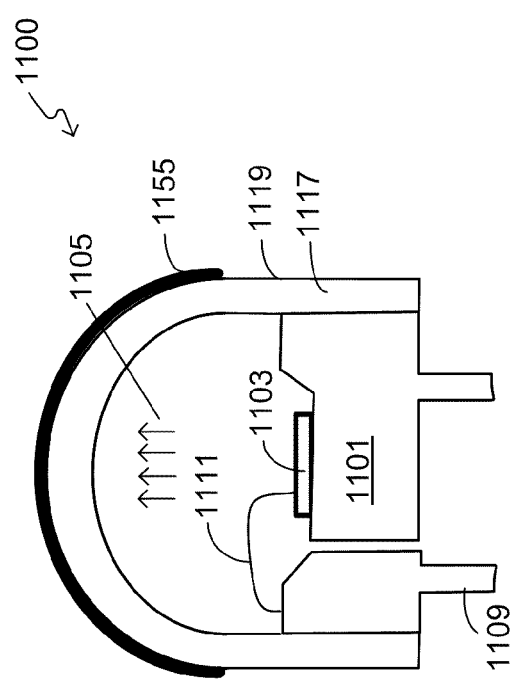
Figure 12
Figure 13
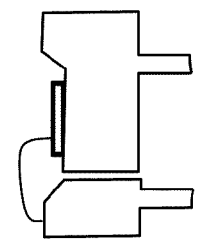
Figure 14
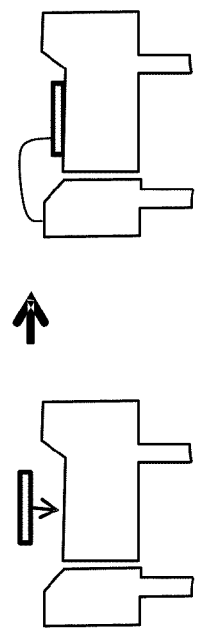
Figure 15

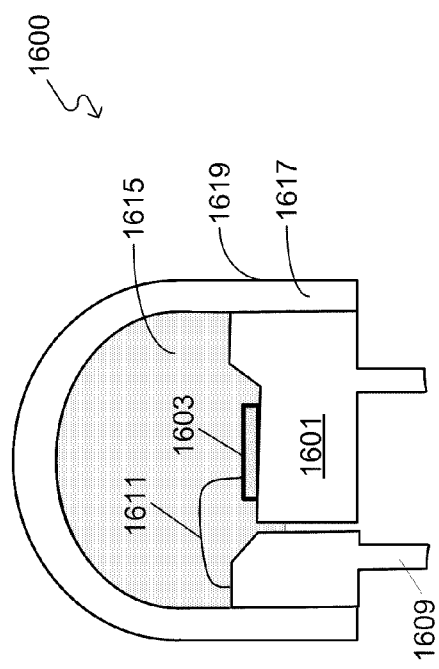
Figure 16
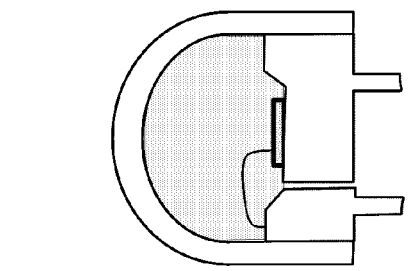
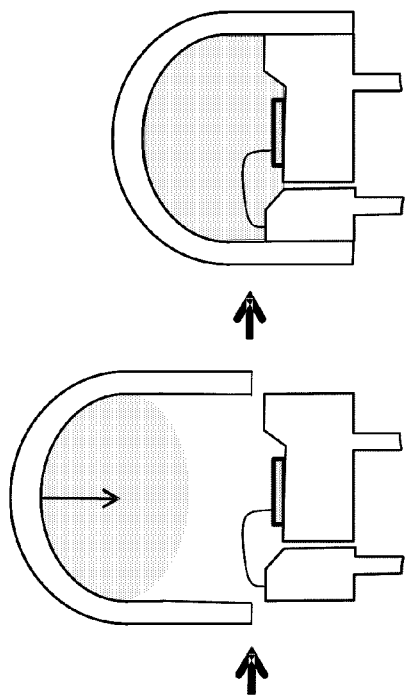
Figure 17  Figure 18  Figure 19  Figure 20

WHITE LIGHT DEVICES USING NON-POLAR OR SEMIPOLAR GALLIUM CONTAINING MATERIALS AND PHOSPHORS

CROSS-REFERENCES TO RELATED APPLICATIONS

This application claims priority to U.S. Provisional Application No. 61/086,139, filed on Aug. 4, 2008, commonly assigned, and of which is incorporated by reference in its entirety for all purpose hereby.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates generally to lighting techniques. More specifically, embodiments of the invention include techniques for combining one or more colored LED devices, such as violet, blue, blue and yellow, or blue and green, fabricated on bulk semipolar or nonpolar materials with use of entities such as phosphors, which emit light. Merely by way of example, the invention can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

In the late 1800's, Thomas Edison invented the light bulb. The conventional light bulb, commonly called the "Edison bulb," has been used for over one hundred years. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light. Unfortunately, drawbacks exist with the conventional Edison light bulb. That is, the conventional light bulb dissipates much thermal energy. More than 90% of the energy used for the conventional light bulb dissipates as thermal energy. Additionally, the conventional light bulb routinely fails often due to thermal expansion and contraction of the filament element.

To overcome some of the drawbacks of the conventional light bulb, fluorescent lighting has been developed. Fluorescent lighting uses an optically clear tube structure filled with a halogen gas and, which typically also contains mercury. A pair of electrodes is coupled between the halogen gas and couples to an alternating power source through a ballast. Once the gas has been excited, it discharges to emit light. Typically, the optically clear tube is coated with phosphors, which are excited by the light. Many building structures use fluorescent lighting and, more recently, fluorescent lighting has been fitted onto a base structure, which couples into a standard socket.

Solid state lighting techniques have also been used. Solid state lighting relies upon semiconductor materials to produce light emitting diodes, commonly called LEDs. At first, red LEDs were demonstrated and introduced into commerce. Red LEDs use Aluminum Indium Gallium Phosphide or AlInGaP semiconductor materials. Most recently, Shuji Nakamura pioneered the use of InGaN materials to produce LEDs emitting light in the blue color range for blue LEDs. The blue colored LEDs led to innovations such as solid state white lighting, the blue laser diode, which in turn enabled the Blu-Ray™ (trademark of the Blu-Ray Disc Association) DVD player, and other developments. Other colored LEDs have also been proposed.

High intensity UV, blue, and green LEDs based on GaN have been proposed and even demonstrated with some success. Efficiencies have typically been highest in the UV-violet, dropping off as the emission wavelength increases to blue or green. Unfortunately, achieving high intensity, high-efficiency GaN-based green LEDs has been particularly problematic. The performance of optoelectronic devices fabricated on conventional c-plane GaN suffer from strong internal polarization fields, which spatially separate the electron and hole wave functions and lead to poor radiative recombination efficiency. Since this phenomenon becomes more pronounced in InGaN layers with increased indium content for increased wavelength emission, extending the performance of UV or blue GaN-based LEDs to the blue-green or green regime has been difficult. Furthermore, since increased indium content films often require reduced growth temperature, the crystal quality of the InGaN films is degraded. The difficulty of achieving a high intensity green LED has lead scientists and engineers to the term "green gap" to describe the unavailability of such green LED. In addition, the light emission efficiency of typical GaN-based LEDs drops off significantly at higher current densities, as are required for general illumination applications, a phenomenon known as "roll-over." Other limitations with blue LEDs using c-plane GaN exist. These limitations include poor yields, low efficiencies, and reliability issues. Although highly successful, solid state lighting techniques must be improved for full exploitation of their potential. These and other limitations may be described throughout the present specification and more particularly below.

From the above, it is seen that techniques for improving optical devices is highly desired.

BRIEF SUMMARY OF THE INVENTION

According to the present invention, techniques generally for lighting are provided. More specifically, embodiments of the invention include techniques for combining one or more colored LED devices, such as violet, blue, blue and yellow, or blue and green, fabricated on bulk semipolar or nonpolar materials with use of entities such as phosphors, which emit light. Merely by way of example, the invention can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

In a specific embodiment, the present invention provides a packaged light emitting device. The packaged device includes a substrate member comprising a surface region. One or more light emitting diode devices are overlying the surface region. At least one of the light emitting diode device is fabricated on a semipolar or nonpolar gallium and nitrogen (e.g., GaN) containing substrate. The one or more light emitting diode devices are fabricated on the semipolar or nonpolar gallium and nitrogen (e.g., GaN) containing substrate emits substantially polarized emission of one or more first wavelengths. In a specific embodiment, the device also has an optically transparent member coupled to the one or more light emitting diode devices. An optical path is provided between the one or more light emitting diode devices and the optically transparent member. In a specific embodiment, a thickness of one or more entities is within a vicinity of or formed overlying the optically transparent member. Alternatively, the one or more entities are formed within the optically transparent member or underlying the optically transparent member or any combination of these configurations. The one or more of the entities are excited by the substantially polarized emission, which is direct or reflected or a combination of them, to emit electromagnetic radiation at one or more second wavelengths.

In a specific embodiment, the present invention includes device configurations having different spatial locations for the thickness of the one or more entities. In a specific embodiment, the thickness of the one or more entities is formed within the optically transparent member. Alternatively, the thickness of the one or more entities is formed underlying the optically transparent member according to a specific embodiment. In yet an alternative specific embodiment, the thickness of the one or more entities is formed within a spatial region of the light path between the one or more light emitting diode devices and the optically transparent member. Still further, the present device can have any combination of these configurations, and others. Of course, there can be variations, modifications, and alternatives.

In yet an alternative specific embodiment, the present invention provides a packaged light emitting device. The device includes a substrate member comprising a surface region and one or more light emitting diode devices overlying the surface region. In a specific embodiment, at least one of the light emitting diode device is fabricated on a semipolar or nonpolar gallium and nitrogen (e.g., GaN) containing substrate. The one or more light emitting diode devices are fabricated on the semipolar or nonpolar gallium and nitrogen (e.g., GaN) containing substrate emits substantially polarized emission of one or more first wavelengths. At least at least one of the light emitting diode devices comprise a quantum well region, which is characterized by an electron wave function and a hole wave function. In a specific embodiment, the electron wave function and the hole wave function are substantially overlapped within a predetermined spatial region of the quantum well region. In a specific embodiment, the device has a thickness of one or more entities formed overlying the one or more light emitting diode devices. The one or more entities are excited by the substantially polarized emission and emitting electromagnetic radiation of one or more second wavelengths.

Still further, the present invention provides a packaged light emitting device. The device includes a substrate member comprising a surface region. The device includes one or more light emitting diode devices overlying the surface region according to a specific embodiment. At least one of the light emitting diode device is fabricated on a semipolar or nonpolar gallium and nitrogen (e.g., GaN) containing substrate. In a specific embodiment, the one or more light emitting diode devices fabricated on the semipolar or nonpolar gallium and nitrogen (e.g. GaN) containing substrate emits substantially polarized emission of one or more first wavelengths. The device also has at least one of the light emitting diode devices comprising a quantum well region, which is characterized by an electron wave function and a hole wave function according to a specific embodiment. The electron wave function and the hole wave function are substantially overlapped within a predetermined spatial region of the quantum well region. The device also has a thickness of one or more entities operably coupled to the one or more light emitting diode devices. In a specific embodiment, the one or more entities are excited by the substantially polarized emission and emitting electromagnetic radiation of one or more second wavelengths. Depending upon the embodiment, the one or more entities are formed overlying the one or more light emitting diode devices, are within a vicinity of the one or more light emitting diode devices, and/or are spatially separated from the one or more light emitting devices. In one or more embodiments, the electromagnetic radiation is characterized by reflected emission, direct emission, or a combination of reflected and direct emission. Of course, there can be other variations, modifications, and alternatives.

In yet an alternative embodiment, the present invention provides a method of assembling a light emitting device. The method includes providing a substrate member comprising a surface region according to a specific embodiment. The method also includes coupling one or more light emitting diode devices overlying the surface region. At least one of the light emitting diode device is fabricated on a semipolar or nonpolar gallium and nitrogen containing substrate. The one or more light emitting diode devices is fabricated on the semipolar or nonpolar gallium and nitrogen containing substrate emits substantially polarized emission of one or more first wavelengths according to a specific embodiment. At least one of the light emitting diode devices comprises a quantum well region, which is characterized by an electron wave function and a hole wave function. The electron wave function and the hole wave function are substantially overlapped within a predetermined spatial region of the quantum well region according to a specific embodiment. The method includes coupling a thickness of one or more entities to the one or more light emitting diode devices. The one or more entities is excited by the substantially polarized emission and emitting electromagnetic radiation of one or more second wavelengths according to a specific embodiment.

Moreover, the present invention provides a method assembling a light emitting device. The method includes providing a substrate member comprising a surface region according to a specific embodiment. The method includes coupling one or more light emitting diode devices overlying the surface region. At least one of the light emitting diode devices is fabricated on a semipolar or nonpolar GaN containing substrate. The at least one or more light emitting diode devices is fabricated on the semipolar or nonpolar GaN containing substrate emitting substantially polarized emission of one or more first wavelengths. The method includes coupling an optically transparent member to the one or more light emitting diode devices. The one or more light emitting diode devices and the optically transparent member comprise an optical path provided between the one or more light emitting diode devices and the optically transparent member. The method also includes coupling a thickness of one or more entities within a vicinity of the optically transparent member. One or more of the entities are excited by the substantially polarized emission to emit electromagnetic radiation at one or more second wavelengths.

One or more benefits may be achieved using one or more of the specific embodiments. As an example, the present device and method provides for an improved lighting technique with improved efficiencies. In other embodiments, the present method and resulting structure are easier to implement using conventional technologies. In some embodiments, the present device and method provide a mix of polarized and unpolarized light that are useful in displays and in conjunction with polarizing transmission filters. In a specific embodiment, the blue LED device is capable of emitting electromagnetic radiation at a wavelength range from about 450 nanometers to about 495 nanometers and the yellow-green LED device is capable of emitting electromagnetic radiation at a wavelength range from about 495 nanometers to about 590 nanometers, although there can also be some variations. Depending upon the embodiment, one or more of these benefits can be achieved. These and other benefits are further described throughout the present specification and more particularly below.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIG. 1 is a simplified diagram of a packaged light emitting device using a recessed configuration according to an embodiment of the present invention;

FIGS. 2 through 5 illustrate a simplified method of assembling the light emitting device of FIG. 1 according to an embodiment of the present invention;

FIG. 11 is a simplified diagram of yet an alternative packaged light emitting device using an optical path to a plane region according to an embodiment of the present invention;

FIGS. 12 through 15 illustrate a simplified method of assembling the light emitting device of FIG. 11 according to an embodiment of the present invention;

FIG. 16 is a simplified diagram of a yet an alternative packaged light emitting device using an optical path to a plane region and filler material according to an embodiment of the present invention;

FIGS. 17 through 20 illustrate a simplified method of assembling the light emitting device of FIG. 16 according to an embodiment of the present invention;

DETAILED DESCRIPTION OF THE INVENTION

Figure 1A:
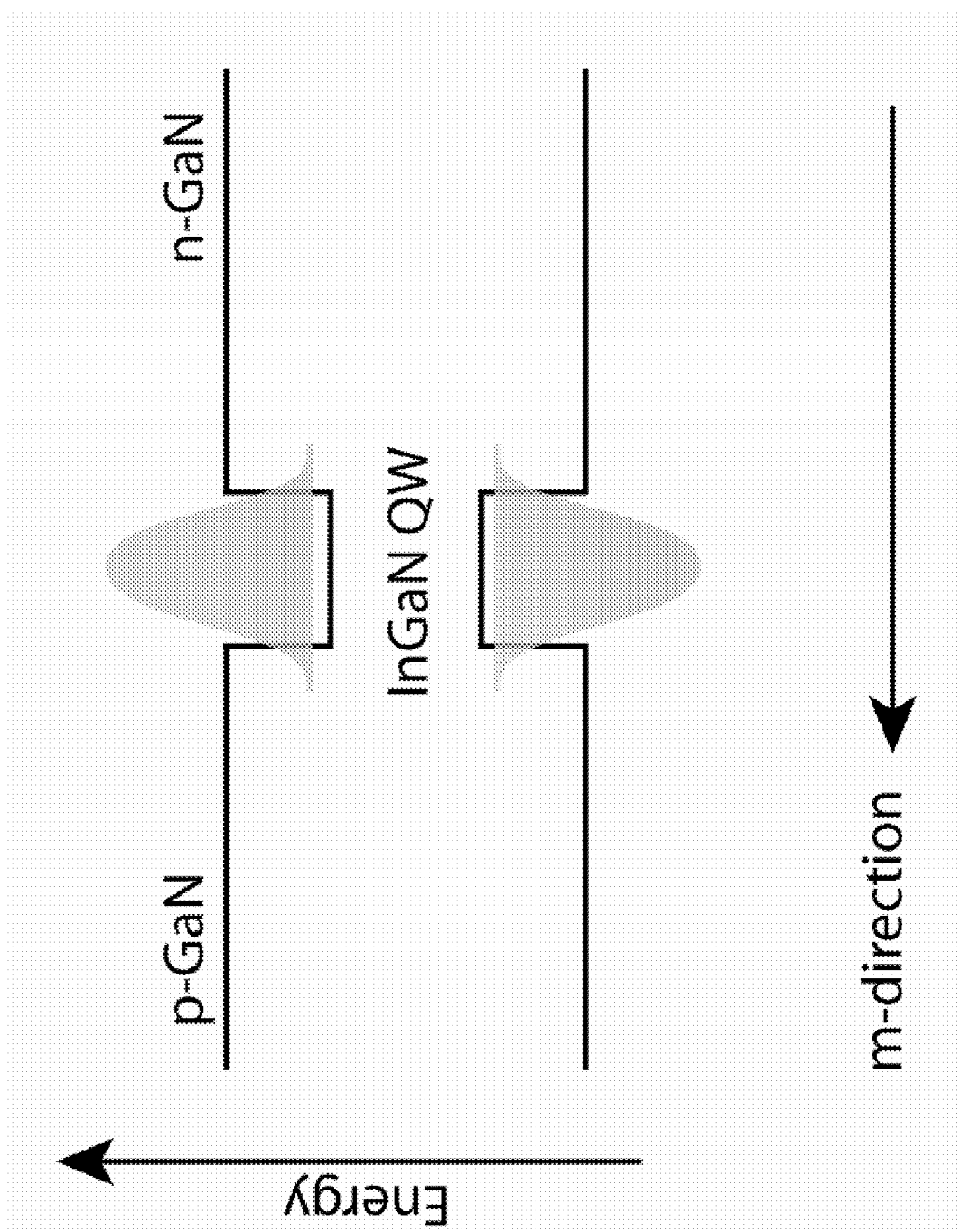
FIG. 1A is an example of an electron/hole wave functions according to an embodiment of the present invention.

According to the present invention, techniques generally for lighting are provided. More specifically, embodiments of the invention include techniques for combining one or more colored LED devices, such as violet, blue, blue and yellow, or blue and green, fabricated on bulk semipolar or nonpolar materials with use of entities such as phosphors, which emit light. Merely by way of example, the invention can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

We have discovered that recent breakthroughs in the field of GaN-based optoelectronics have demonstrated the great potential of devices fabricated on bulk nonpolar and semipolar GaN substrates. The lack of strong polarization induced electric fields that plague conventional devices on c-plane GaN leads to a greatly enhanced radiative recombination efficiency in the light emitting InGaN layers. Furthermore, the nature of the electronic band structure and the anisotropic in-plane strain leads to highly polarized light emission, which will offer several advantages in applications such as display backlighting.

Of particular importance to the field of lighting is the progress of light emitting diodes (LED) fabricated on nonpolar and semipolar GaN substrates. Such devices making use of InGaN light emitting layers have exhibited record output powers at extended operation wavelengths into the violet region (390-430 nm), the blue region (430-490 nm), the green region (490-560 nm), and the yellow region (560-600 nm). For example, a violet LED, with a peak emission wavelength of 402 nm, was recently fabricated on an m-plane (1-100) GaN substrate and demonstrated greater than 45% external quantum efficiency, despite having no light extraction enhancement features, and showed excellent performance at high current densities, with minimal roll-over [K.-C. Kim, M. C. Schmidt, H. Sato, F. Wu, N. Fellows, M. Saito, K. Fujito, J. S. Speck, S. Nakamura, and S. P. DenBaars, "Improved electroluminescence on nonpolar m-plane InGaN/GaN quantum well LEDs", Phys. Stat. Sol. (RRL) 1, No. 3, 125 (2007)]. Similarly, a blue LED, with a peak emission wavelength of 468 nm, exhibited excellent efficiency at high power densities and significantly less roll-over than is typically observed with c-plane LEDs [K. Iso, H. Yamada, H. Hirasawa, N. Fellows, M. Saito, K. Fujito, S. P. DenBaars, J. S. Speck, and S. Nakamura, "High brightness blue InGaN/GaN light emitting diode on nonpolar m-plane bulk GaN substrate", Japanese Journal of Applied Physics 46, L960 (2007)]. Two promising semipolar orientations are the (10-1-1) and (11-22) planes. These planes are inclined by 62.0 degrees and by 58.4 degrees, respectively, with respect to the c-plane. University of California, Santa Barbara (UCSB) has produced highly efficient LEDs on (10-1-1) GaN with over 65 mW output power at 100 mA for blue-emitting devices [H. Zhong, A. Tyagi, N. Fellows, F. Wu, R. B. Chung, M. Saito, K. Fujito, J. S. Speck, S. P. DenBaars, and S. Nakamura, "High power and high efficiency blue light emitting diode on freestanding semipolar (1011) bulk GaN substrate", Applied Physics Letters 90, 233504 (2007)] and on (11-22) GaN with over 35 mW output power at 100 mA for blue-green emitting devices [H. Zhong, A. Tyagi, N. N. Fellows, R. B. Chung, M. Saito, K. Fujito, J. S. Speck, S. P. DenBaars, and S. Nakamura, Electronics Lett. 43, 825 (2007)], over 15 mW of power at 100 mA for green-emitting devices [H. Sato, A. Tyagi, H. Zhong, N. Fellows, R. B. Chung, M. Saito, K. Fujito, J. S. Speck, S. P. DenBaars, and S. Nakamura, "High power and high efficiency green light emitting diode on free-standing semipolar (1122) bulk GaN substrate", Physical Status Solidi—Rapid Research Letters 1, 162 (2007)] and over 15 mW for yellow devices [H. Sato, R. B. Chung, H. Hirasawa, N. Fellows, H. Masui, F. Wu, M. Saito, K. Fujito, J. S. Speck, S. P. DenBaars, and S. Nakamura, "Optical properties of yellow light-emitting diodes grown on semipolar (1122) bulk GaN substrates," Applied Physics Letters 92, 221110 (2008)]. The UCSB group has shown that the indium incorporation on semipolar (11-22) GaN is comparable to or greater than that of c-plane GaN, which provides further promise for achieving high crystal quality extended wavelength emitting InGaN layers.

With high-performance single-color non-polar and semipolar LEDs, several types of white light sources are now possible. In one embodiment, a violet non-polar or semi-polar LED is packaged together with at least one phosphor. In a preferred embodiment, the phosphor comprises a blend of three phosphors, emitting in the blue, the green, and the red. In another embodiment, a blue non-polar or semi-polar LED is packaged together with at least one phosphor. In a preferred embodiment, the phosphor comprises a blend of two phosphors, emitting in the green and the red. In still another embodiment, a green or yellow non-polar or semi-polar LED is packaged together with a blue LED and at least one phosphor. In a preferred embodiment, the phosphor emits in the red. In a preferred embodiment, the blue LED constitutes a blue non-polar or semi-polar LED.

A non-polar or semi-polar LED may be fabricated on a bulk gallium nitride substrate. The gallium nitride substrate may be sliced from a boule that was grown by hydride vapor phase epitaxy or ammonothermally, according to methods known in the art. In one specific embodiment, the gallium nitride substrate is fabricated by a combination of hydride vapor phase epitaxy and ammonothermal growth, as disclosed in U.S. Patent Application No. 61/078,704, commonly assigned, and hereby incorporated by reference herein. The boule may be grown in the c-direction, the m-direction, the a-direction, or in a semi-polar direction on a single-crystal seed crystal. Semipolar planes may be designated by (hkil) Miller indices, where i=−(h+k), l is nonzero and at least one of h and k are nonzero. The gallium nitride substrate may be cut, lapped, polished, and chemical-mechanically polished. The gallium nitride substrate orientation may be within ±5 degrees, ±2 degrees, ±1 degree, or ±0.5 degrees of the $\{1 -1 0 0\}$ m plane, the $\{1 1 -2 0\}$ a plane, the $\{1 1 -2 2\}$ plane, the $\{2 0 -2±1\}$ plane, the $\{1 -1 0 ±1\}$ plane, the $\{1 -1 0 -±2\}$ plane, or the $\{1 -1 0 ±3\}$ plane. The gallium nitride substrate may have a dislocation density in the plane of the large-area surface that is less than $10^6$ cm$^{-2}$, less than $10^5$ cm$^{-2}$, less than $10^4$ cm$^{-2}$, or less than $10^3$ cm$^{-2}$. The gallium nitride substrate may have a dislocation density in the c plane that is less than $10^6$ cm$^{-2}$, less than $10^5$ cm$^{-2}$, less than $10^4$ cm$^{-2}$, or less than $10^3$ cm$^{-2}$.

A homoepitaxial non-polar or semi-polar LED is fabricated on the gallium nitride substrate according to methods that are known in the art, for example, following the methods disclosed in U.S. Pat. No. 7,053,413, which is hereby incorporated by reference in its entirety. At least one $Al_xIn_yGa_{1-x-y}N$ layer, where $0 \leq x \leq 1$, $0 \leq y \leq 1$, and $0 \leq x+y \leq 1$, is deposited on the substrate, for example, following the methods disclosed by U.S. Pat. Nos. 7,338,828 and 7,220,324, which are hereby incorporated by reference in their entirety. The at least one $Al_xIn_yGa_{1-x-y}N$ layer may be deposited by metal-organic chemical vapor deposition, by molecular beam epitaxy, by hydride vapor phase epitaxy, or by a combination thereof. In one embodiment, the $Al_xIn_yGa_{1-x-y}N$ layer comprises an active layer that preferentially emits light when an electrical current is passed through it. In one specific embodiment, the active layer comprises a single quantum well, with a thickness between about 0.5 nm and about 40 nm. In a specific embodiment, the active layer comprises a single quantum well with a thickness between about 1 nm and about 5 nm. In other embodiments, the active layer comprises a single quantum well with a thickness between about 5 nm and about 10 nm, between about 10 nm and about 15 nm, between about 15 nm and about 20 nm, between about 20 nm and about 25 nm, between about 25 nm and about 30 nm, between about 30 nm and about 35 nm, or between about 35 nm and about 40 nm. In another set of embodiments, the active layer comprises a multiple quantum well. In still another embodiment, the active region comprises a double heterostructure, with a thickness between about 40 nm and about 500 nm. In one specific embodiment, the active layer comprises an $In_yGa_{1-y}N$ layer, where $0 \leq y \leq 1$.

In a specific embodiment, the present invention provides novel packages and devices including at least one non-polar or at least one semi-polar homoepitaxial LED is placed on a substrate. The present packages and devices are combined with phosphor entities to discharge white light according to a specific embodiment. Further details of the present packages and methods can be found throughout the present specification and more particularly below.

FIG. 1 is a simplified diagram of a packaged light emitting device 100 using a recessed configuration according to an embodiment of the present invention. This diagram is merely an illustration and should not unduly limit the scope of the claims herein. One of ordinary skill in the art would recognize other variations, modifications, and alternatives. In a specific embodiment, the present invention provides a packaged light emitting device 100. As shown, the device has a substrate member comprising a surface region. In a specific embodiment, the substrate is made of a suitable material such a metal including, but not limited to, Alloy 42, copper, and others, among plastics, dielectrics, and the like. In a specific embodiment, the substrate is generally from a lead frame member such as metal alloy, but can be others.

In a specific embodiment, the present substrate, which holds the LED, can come in various shapes, sizes, and configurations. In a specific embodiment, the surface region of substrate 101 is cupped. Alternatively, the surface region 101 is recessed according to a specific embodiment. Additionally, the surface region generally comprises a smooth surface, plating, or coating. Such plating or coating can be gold, silver, platinum, aluminum, or any pure or alloy material, which is suitable for bonding to an overlying semiconductor material, but can be others. Of course, there can be other variations, modifications, and alternatives.

Referring again to FIG. 1, the device has one or more light emitting diode devices overlying the surface region. At least one of the light emitting diode devices 103 is fabricated on a semipolar or nonpolar GaN containing substrate. In a specific embodiment, the device emits polarized electromagnetic radiation 105. As shown, the light emitting device is coupled to a first potential, which is attached to the substrate, and a second potential 109, which is coupled to wire or lead 111 bonded to a light emitting diode. Of course, there can be other variations, modifications, and alternatives.

In a specific embodiment, the device has at least one of the light emitting diode devices comprising a quantum well region. In a specific embodiment, the quantum well region is characterized by an electron wave function and a hole wave function. The electron wave function and the hole wave function are substantially overlapped within a predetermined spatial region of the quantum well region according to a specific embodiment. An example of the electron wave function and the hole wave function is provided by FIG. 1A, but can be others. Of course, there can be other variations, modifications, and alternatives.

In a preferred embodiment, the one or more light emitting diode device comprises at least a blue LED device. In a specific embodiment, the substantially polarized emission is blue light. The one or more light emitting diode device comprises at least a blue LED device capable of emitting electromagnetic radiation at a range from about 430 nanometers to about 490 nanometers, which is substantially polarized emission being blue light. In a specific embodiment, a {1 -1 0 0} m-plane bulk substrate is provided for the nonpolar blue LED. In another specific embodiment, a {1 0 -1 -1} semi-polar bulk substrate is provided for the semipolar blue LED. The substrate has a flat surface, with a root-mean-square (RMS) roughness of about 0.1 nm, a threading dislocation density less than $5 \times 10^6$ cm$^{-2}$, and a carrier concentration of about $1 \times 10^{17}$ cm$^{-3}$. Epitaxial layers are deposited on the substrate by metalorganic chemical vapor deposition (MOCVD) at atmospheric pressure. The ratio of the flow rate of the group V precursor (ammonia) to that of the group III precursor (trimethyl gallium, trimethyl indium, trimethyl aluminum) during growth is between about 3000 and about 12000. First, a contact layer of n-type (silicon-doped) GaN is deposited on the substrate, with a thickness of about 5 microns and a doping level of about $2 \times 10^{18}$ cm$^{-3}$. Next, an undoped InGaN/GaN multiple quantum well (MQW) is deposited as the active layer. The MQW superlattice has six periods, comprising alternating layers of 8 nm of InGaN and 37.5 nm of GaN as the barrier layers. Next, a 10 nm undoped AlGaN electron blocking layer is deposited. Finally, a p-type GaN contact layer is deposited, with a thickness of about 200 nm and a hole concentration of about $7 \times 10^{17}$ cm$^{-3}$. Indium tin oxide (ITO) is e-beam evaporated onto the p-type contact layer as the p-type contact and rapid-thermal-annealed. LED mesas, with a size of about $300 \times 300$ μm$^2$, are formed by photolithography and dry etching using a chlorine-based inductively-coupled plasma (ICP) technique. Ti/Al/Ni/Au is e-beam evaporated onto the exposed n-GaN layer to form the n-type contact, Ti/Au is e-beam evaporated onto a portion of the ITO layer to form a p-contact pad, and the wafer is diced into discrete LED dies. Electrical contacts are formed by conventional wire bonding. Of course, there can be other variations, modifications, and alternatives.

In a specific embodiment, the present device also has a thickness 115 of one or more entities formed overlying the one or more light emitting diode devices. In a specific embodiment, the one or more entities are excited by the substantially polarized emission and emit electromagnetic radiation of one or more second wavelengths. In a preferred embodiment, the plurality of entities is capable of emitting substantially yellow light from an interaction with the substantially polarized emission of blue light. In a specific embodiment, the thickness of the plurality of entities, which are phosphor entities, is about five microns and less. Of course, there can be other variations, modifications, and alternatives.

In a specific embodiment, the one or more entities comprises a phosphor or phosphor blend selected from one or more of $(Y,Gd,Tb,Sc,Lu,La)_3(Al,Ga,In)_5O_{12}:Ce^{3+}$, $SrGa_2S_4:Eu^{2+}$, $SrS:Eu^{2+}$, and colloidal quantum dot thin films comprising CdTe, ZnS, ZnSe, ZnTe, CdSe, or CdTe. In other embodiments, the device may include a phosphor capable of emitting substantially red light. Such phosphor is selected from one or more of $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $Y_2(O,S)_3:Eu^{3+}$; $Ca_{1-x}Mo_{1-y}Si_yO_4$: where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^2$; $CaLa_2S_4:Ce^{3+}$; $(Ca,Sr)S:Eu^{2+}$; $3.5MgO* 0.5 MgF_2* GeO_2:Mn^{4+}$ (MFG); $(Ba,Sr,Ca)Mg_xP_2O_7:Eu^{2-}$, $Mn^{2+}$; $(Y,Lu)_2WO_6:Eu^{3+}$, $Mo^{6+}$; $(Ba,Sr,Ca)_3Mg_xSi_2 O_8$: $Eu^{2+}$, $Mn^{2+}$, wherein $1 < x \leq 2$; $(RE_{1-y}Ce_y)Mg_{2-x}Li_xSi_{3-x}P_xO_{12}$, where RE is at least one of Sc, Lu, Gd, Y, and Tb, $0.0001 < x < 0.1$ and $0.001 < y < 0.1$; $(Y,Gd,Lu,La)_{2-x} Eu_xW_{1-y}MO_yO_6$, where $0.5 \leq x \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$ wherein M is selected from the group of Sc, Y, a lanthanide, an alkali earth metal and mixtures thereof, X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof. Of course, there can be other variations, modifications, and alternatives.

In a specific embodiment, the one or more light emitting diode device comprises at least a violet LED device capable of emitting electromagnetic radiation at a range from about 380 nanometers to about 440 nanometers and the one or more entities are capable of emitting substantially white light, the substantially polarized emission being violet light. In a specific embodiment, a (1 -1 0 0) m-plane bulk substrate is provided for the nonpolar violet LED. The substrate has a flat surface, with a root-mean-square (RMS) roughness of about 0.1 nm, a threading dislocation density less than $5 \times 10^6$ cm$^{-2}$, and a carrier concentration of about $1 \times 10^{17}$ cm$^{-3}$. Epitaxial layers are deposited on the substrate by metalorganic chemical vapor deposition (MOCVD) at atmospheric pressure. The ratio of the flow rate of the group V precursor (ammonia) to that of the group III precursor (trimethyl gallium, trimethyl indium, trimethyl aluminum) during growth is between about 3000 and about 12000. First, a contact layer of n-type (silicon-doped) GaN is deposited on the substrate, with a thickness of about 5 microns and a doping level of about $2 \times 10^{18}$ cm$^{-3}$. Next, an undoped InGaN/GaN multiple quantum well (MQW) is deposited as the active layer. The MQW superlattice has six periods, comprising alternating layers of 16 nm of InGaN and 18 nm of GaN as the barrier layers. Next, a 10 nm undoped AlGaN electron blocking layer is deposited. Finally, a p-type GaN contact layer is deposited, with a thickness of about 160 nm and a hole concentration of about $7 \times 10^{17}$ cm$^{-3}$. Indium tin oxide (ITO) is e-beam evaporated onto the p-type contact layer as the p-type contact and rapid-thermal-annealed. LED mesas, with a size of about $300 \times 300$ μm$^2$, are formed by photolithography and dry etching. Ti/Al/Ni/Au is e-beam evaporated onto the exposed n-GaN layer to form the n-type contact, Ti/Au is e-beam evaporated onto a portion of the ITO layer to form a contact pad, and the wafer is diced into discrete LED dies. Electrical contacts are formed by conventional wire bonding. Other colored LEDs may also be used or combined according to a specific embodiment. Of course, there can be other variations, modifications, and alternatives.

In a specific embodiment, a (1 1 -2 2} bulk substrate is provided for a semipolar green LED. The substrate has a flat surface, with a root-mean-square (RMS) roughness of about 0.1 nm, a threading dislocation density less than $5 \times 10^6$ cm$^{-2}$, and a carrier concentration of about $1 \times 10^{17}$ cm$^{-3}$. Epitaxial layers are deposited on the substrate by metalorganic chemical vapor deposition (MOCVD) at atmospheric pressure. The ratio of the flow rate of the group V precursor (ammonia) to that of the group III precursor (trimethyl gallium, trimethyl indium, trimethyl aluminum) during growth between about 3000 and about 12000. First, a contact layer of n-type (silicon-doped) GaN is deposited on the substrate, with a thickness of about 1 micron and a doping level of about $2 \times 10^{18}$ cm$^{-3}$. Next, an InGaN/GaN multiple quantum well (MQW) is deposited as the active layer. The MQW superlattice has six periods, comprising alternating layers of 4 nm of InGaN and 20 nm of Si-doped GaN as the barrier layers and ending with an undoped 16 nm GaN barrier layer and a 10 nm undoped $Al_{0.15}Ga_{0.85}N$ electron blocking layer. Finally, a p-type GaN contact layer is deposited, with a thickness of about 200 nm and a hole concentration of about $7 \times 10^{17}$ cm$^{-3}$. Indium tin oxide (ITO) is e-beam evaporated onto the p-type contact layer as the p-type contact and rapid-thermal-annealed. LED mesas, with a size of about $200 \times 550$ μm$^2$, are formed by photolithography and dry etching. Ti/Al/Ni/Au is e-beam evaporated onto the exposed n-GaN layer to form the n-type contact, Ti/Au is e-beam evaporated onto a portion of the ITO layer to form a contact pad, and the wafer is diced into discrete LED dies. Electrical contacts are formed by conventional wire bonding.

In another specific embodiment, a (1 1 −2 2} bulk substrate is provided for a semipolar yellow LED. The substrate has a flat surface, with a root-mean-square (RMS) roughness of about 0.1 nm, a threading dislocation density less than $5 \times 10^6$ $cm^{-2}$, and a carrier concentration of about $1 \times 10^{17}$ $cm^{-3}$. Epitaxial layers are deposited on the substrate by metalorganic chemical vapor deposition (MOCVD) at atmospheric pressure. The ratio of the flow rate of the group V precursor (ammonia) to that of the group III precursor (trimethyl gallium, trimethyl indium, trimethyl aluminum) during growth between about 3000 and about 12000. First, a contact layer of n-type (silicon-doped) GaN is deposited on the substrate, with a thickness of about 2 microns and a doping level of about $2 \times 10^{18}$ $cm^{-3}$. Next, a single quantum well (SQW) is deposited as the active layer. The SQW comprises a 3.5 nm InGaN layer and is terminated by an undoped 16 nm GaN barrier layer and a 7 nm undoped $Al_{0.15}Ga_{0.85}N$ electron blocking layer. Finally, a Mg-doped p-type GaN contact layer is deposited, with a thickness of about 200 nm and a hole concentration of about $7 \times 10^{17}$ $cm^{-3}$. Indium tin oxide (ITO) is e-beam evaporated onto the p-type contact layer as the p-type contact and rapid-thermal-annealed. LED mesas, with a size of about $600 \times 450$ $\mu m^2$, are formed by photolithography and dry etching. Ti/Al/Ni/Au is e-beam evaporated onto the exposed n-GaN layer to form the n-type contact, Ti/Au is e-beam evaporated onto a portion of the ITO layer to form a contact pad, and the wafer is diced into discrete LED dies. Electrical contacts are formed by conventional wire bonding.

In a specific embodiment, the one or more entities comprise a blend of phosphors capable of emitting substantially blue light, substantially green light, and substantially red light. As an example, the blue emitting phosphor is selected from the group consisting of $(Ba,Sr,Ca)_5(PO_4)_3(Cl,F,Br,OH):Eu^{2+}$, $Mn^{2+}$; $Sb^{3+}$,$(Ba,Sr,Ca)MgAl_{10}O_{17}:Eu^{2+}$, $Mn^{2+}$; $(Ba,Sr,Ca)BPO_5:Eu^{2+}$, $Mn^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_8*2SrCl_2:Eu^{2+}$; $(Ba,Sr,Ca)Mg_xP_2O_7:Eu^{2+}$, $Mn^{2+}$; $Sr_4Al_{14}O_{25}:Eu^{2+}$ (SAE); $BaAl_8O_{13}:Eu^{2+}$; and mixtures thereof. As an example, the green phosphor is selected from the group consisting of $(Ba,Sr,Ca)MgAl_{10}O_{17}:Eu^{2+}$, $Mn^{2+}$ (BAMn); $(Ba,Sr,Ca)Al_2O_4:Eu^{2+}$; $(Y,Gd,Lu,Sc,La)BO_3:Ce^{3+}$, $Tb^{3+}$; $Ca_8Mg(SiO_4)_4Cl_2:Eu^{2+}$, $Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4C_{12}:Eu^{2+}$, $Mn^{2+}$ (CASI); $Na_2Gd_2B_2O_7:Ce^{3+}$, $Tb^{3+}$; $(Ba,Sr)_2(Ca,Mg,Zn)B_2O_6:K,Ce,Tb$; and mixtures thereof. As an example, the red phosphor is selected from the group consisting of $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $Y_2(O,S)_3:Eu^{3+}$; $Ca_{1-x}Mo_{1-y}Si_yO_4$: where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2-}$, $Mn^{2+}$; $(Y,Lu)_2WO_6:Eu^{3+}$, $Mo^{6+}$; $(Ba,Sr,Ca)_3Mg_xSi_2O_8:Eu^{2+}$, $Mn^{2+}$, wherein $1<x \leq 2$; $(RE_{1-y}Ce_y)Mg_{2-x}Li_xSi_{3-x}P_xO_{12}$, where RE is at least one of Sc, Lu, Gd, Y, and Tb, $0.0001<x<0.1$ and $0.001<y<0.1$; $(Y,Gd,Lu,La)_{2-x}Eu_xW_{1-y}Mo_yO_6$, where $0.5 \leq x \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$, wherein M is selected from the group of Sc, Y, a lanthanide, an alkali earth metal and mixtures thereof, X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof.

In a specific embodiment, the above has been generally described in terms of one or more entities that may be one or more phosphor materials or phosphor like materials, but it would be recognized that other "energy-converting luminescent materials", which may include phosphors, semiconductors, semiconductor nanoparticles ("quantum dots"), organic luminescent materials, and the like, and combinations of them, and also be used. In one or more preferred embodiments, the energy converting luminescent materials can generally be a wavelength converting material and/or materials. Of course, there can be other variations, modifications, and alternatives.

In a specific embodiment, the present packaged device includes an enclosure 117. The enclosure can be made of a suitable material such as an optically transparent plastic, glass, or other material. As also shown, the enclosure has a suitable shape 119 according to a specific embodiment. The shape can be annular, circular, egg-shaped, trapezoidal, or any combination of these shapes. Depending upon the embodiment, the enclosure with suitable shape and material is configured to facilitate and even optimize transmission of electromagnetic radiation from the LED device with coating through the surface region of the enclosure. Of course, there can be other variations, modifications, and alternatives.

FIGS. 2 through 5 illustrate a simplified method of assembling the light emitting device of FIG. 1 according to an embodiment of the present invention. These diagrams are merely illustrations and should not unduly limit the scope of the claims herein. One of ordinary skill in the art would recognize other variations, modifications, and alternatives. As shown is a method for assembling an LED device according to an embodiment of the present invention. The method includes providing a substrate member 101 comprising a surface region. In a specific embodiment, the substrate is made of a suitable material such a metal including, but not limited to, Alloy 42, copper, dielectrics, plastics, or others. In a specific embodiment, the substrate is generally from a lead frame member such as a metal alloy, but can be others.

In a specific embodiment, the present substrate, which holds the LED, can come in various shapes, sizes, and configurations. In a specific embodiment, the surface region of substrate 101 is cupped. Alternatively, the surface region 101 is recessed according to a specific embodiment. Additionally, the surface region is generally a smooth surface, plating, or coating. Such plating or coating can be gold, silver, platinum, aluminum, or any pure or alloy material, which is suitable for bonding to an overlying semiconductor material, but can be others. Of course, there can be other variations, modifications, and alternatives.

In a specific embodiment, the method includes providing one or more light emitting diode devices overlying the surface region. At least one of the light emitting diode devices 103 is fabricated on a semipolar or nonpolar GaN containing substrate. In a specific embodiment, the device emits polarized electromagnetic radiation 105. As shown, the light emitting device is coupled to a first potential, which is attached to the substrate, and a second potential 109, which is coupled to wire or lead 111 bonded to a light emitting diode. Of course, there can be other variations, modifications, and alternatives.

In a preferred embodiment, the one or more light emitting diode device comprises at least a blue LED device. In a specific embodiment, the substantially polarized emission is blue light. The one or more light emitting diode device comprises at least a blue LED device capable of emitting electromagnetic radiation at a range from about 430 nanometers to about 490 nanometers, which is substantially polarized emission being blue light.

In a specific embodiment, the LED device is attached onto the surface region of the substrate. The attachment occurs by silver paste, eutectic, gold eutectic, or other suitable techniques. In a preferred embodiment, the LED device is attached using die attach methods such as eutectic bonding of metals such as gold, silver, or platinum, among others. Of course, there can be other variations, modifications, and alternatives.

Referring now to FIG. 3, the present method includes bonding wiring 115 from lead 109 to a bonding pad on the LED device. In a specific embodiment, the wire is a suitable material such as gold, aluminum, or others. In a specific embodiment, wire bonding uses techniques such as ultrasonic, megasonic, or others. Of course, there can be other variations, modifications, and alternatives.

Referring now to FIG. 4, the method includes providing a thickness 115 of one or more entities formed overlying the one or more light emitting diode devices. In a specific embodiment, the one or more entities are excited by the substantially polarized emission and emit electromagnetic radiation of one or more second wavelengths. In a preferred embodiment, the plurality of entities is capable of emitting substantially yellow light from an interaction with the substantially polarized emission of blue light. In a specific embodiment, the thickness of the plurality of entities, which are phosphor entities, is about five microns and less. Of course, there can be other variations, modifications, and alternatives.

In a specific embodiment, the one or more entities comprises a phosphor or phosphor blend selected from one or more of $(Y,Gd,Tb,Sc,Lu,La)_3(Al,Ga,In)_5O_{12}:Ce^{3+}$, $SrGa_2S_4:Eu^{2+}$, $SrS:Eu^{2+}$, and colloidal quantum dot thin films comprising CdTe, ZnS, ZnSe, ZnTe, CdSe, or CdTe. In other embodiments, the device may include a phosphor capable of emitting substantially red light. Such phosphor is be selected from $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $Y_2(O,S)_3:Eu^{3+}$; $Ca_{1-x}Mo_{1-y}Si_yO_4$: where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2-}$, $Mn^{2+}$; $(Y,Lu)_2WO_6:Eu^{3+}$, $Mo^{6+}$; $(Ba,Sr,Ca)_3Mg_xSi_2O_8:Eu^{2+}$, $Mn^{2+}$, wherein $1 \leq x \leq 2$; $(RE_{1-y}Ce_y)Mg_{2-x}Li_xSi_{3-x}P_xO_{12}$, where RE is at least one of Sc, Lu, Gd, Y, and Tb, $0.0001 < x < 0.1$ and $0.001 < y < 0.1$; $(Y,Gd,Lu,La)_{2-x}Eu_xW_{1-y}Mo_yO_6$, where $0.5 \leq x \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$ wherein M is selected from the group of Sc, Y, a lanthanide, an alkali earth metal and mixtures thereof, X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof. Of course, there can be other variations, modifications, and alternatives.

In a specific embodiment, the one or more entities comprise a blend of phosphors capable of emitting substantially blue light, substantially green light, and substantially red light. As an example, the blue emitting phosphor is selected from the group consisting of $(Ba,Sr,Ca)_5(PO_4)_3(Cl,F,Br,OH):Eu^{2+}$, $Mn^{2+}$; $Sb^{3+}$, $(Ba,Sr,Ca)MgAl_{10}O_{17}:Eu^{2+}$, $Mn^{2+}$; $(Ba,Sr,Ca)BPO_5:Eu^{2+}$, $Mn^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_8*2SrCl_2:Eu^{2+}$; $(Ba,Sr,Ca)Mg_xP_2O_7:Eu^{2+}$, $Mn^{2+}$; $Sr_4Al_{14}O_{25}:Eu^{2+}$ (SAE); $BaAl_8O_{13}:Eu^{2+}$; and mixtures thereof. As an example, the green phosphor is selected from the group consisting of $(Ba,Sr,Ca)MgAl_{10}O_{17}:Eu^{2+}$, $Mn^{2+}$ (BAMn); $(Ba,Sr,Ca)Al_2O_4:Eu^{2+}$; $(Y,Gd,Lu,Sc,La)BO_3:Ce^{3+},Tb^{3+}$; $Ca_8Mg(SiO_4)_4C_{12}:Eu^{2+}$, $Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4C_{12}:Eu^{2+}$, $Mn^{2+}$ (CASI); $Na_2Gd_2B_2O_7:Ce^{3+}$, $Tb^{3+}$; $(Ba,Sr)_2(Ca,Mg,Zn)B_2O_6:K,Ce,Tb$; and mixtures thereof. As an example, the red phosphor is selected from the group consisting of $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $Y_2(O,S)_3:Eu^{3+}$; $Ca_{1-x}Mo_{1-y}Si_yO_4$: where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2-}$, $Mn^{2+}$; $(Y,Lu)_2WO_6:Eu^{3+}$, $Mo^{6+}$; $(Ba,Sr,Ca)_3Mg_xSi_2O_8:Eu^{2+}$, $Mn^{2+}$, wherein $1 \leq x \leq 2$; $(RE_{1-y}Ce_y)Mg_{2-x}Li_xSi_{3-x}P_xO_{12}$, where RE is at least one of Sc, Lu, Gd, Y, and Tb, $0.0001 \leq x \leq 0.1$ and $0.001 < y < 0.1$; $(Y,Gd,Lu,La)_{2-x}Eu_xW_{1-y}Mo_yO_6$, where $0.5 \leq x \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$, wherein M is selected from the group of Sc, Y, a lanthanide, an alkali earth metal and mixtures thereof, X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof.

In a specific embodiment, the entities are coated onto the surface region of the LED device using a suitable technique. Such technique can include deposition, spraying, plating, coating, spin coating, electrophoretic deposition, sputtering, dipping, dispensing, sedimentation, ink-jet printing, and screen printing. In a specific embodiment, the deposition can be an electrostatic techniques to provide for uniformity and a high quality coating. In a specific embodiment, the entities have a uniformity of about 10 percent to about 0.1 percent. In some embodiments, the entities are coated onto the surface region of the LED device prior to its separation from a wafer into discrete dies.

In a specific embodiment, the present method includes providing an enclosure 117 overlying the LED device, which has been mounted, bonded, and coated. The enclosure can be made of a suitable material such as an optically transparent plastic, glass, or other material. As also shown, the enclosure has a suitable shape 119 according to a specific embodiment. The shape can be annular, circular, egg-shaped, trapezoidal, or any combination of these shapes. Depending upon the embodiment, the enclosure with suitable shape and material is configured to facilitate and even optimize transmission of electromagnetic radiation from the LED device with coating through the surface region of the enclosure. Of course, there can be other variations, modifications, and alternatives.

Figure 6:
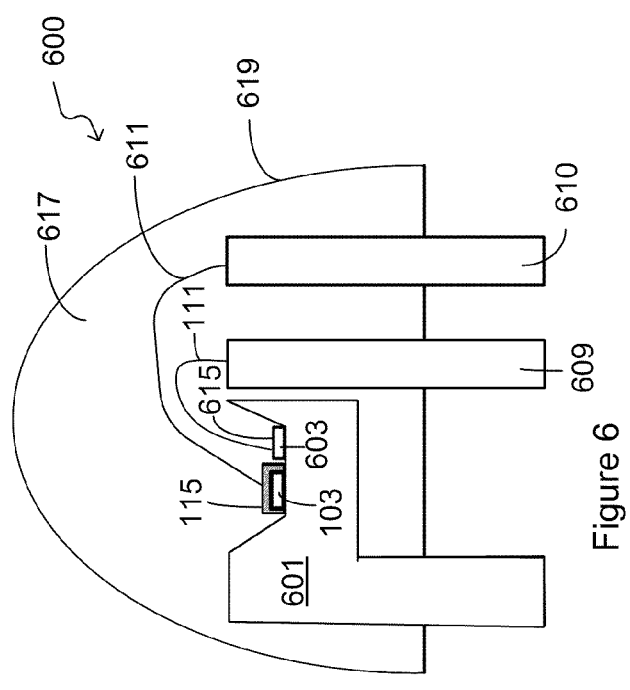
FIG. 6 is a simplified diagram of an alternative packaged light emitting device using multiple devices according to an embodiment of the present invention.
Figure 7:
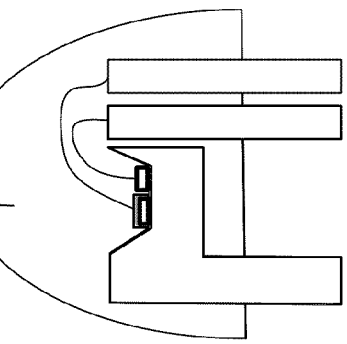
FIGS. 7 through 10 illustrate a simplified method of assembling the light emitting device of FIG. 6 according to an embodiment of the present invention.
Figure 8:
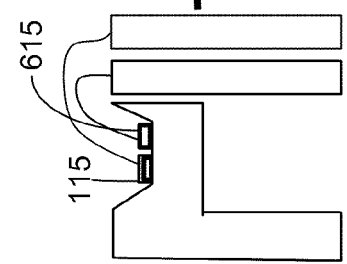
Figure 9:
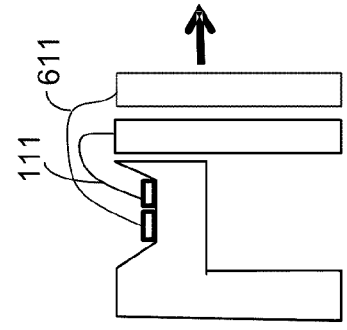
Figure 10:
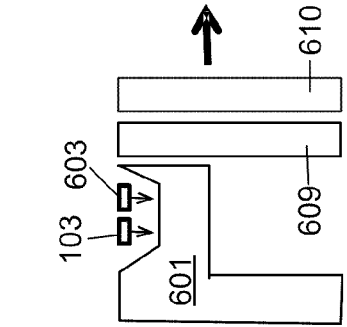

FIG. 6 is a simplified diagram of an alternative packaged light emitting device 600 using multiple devices according to an embodiment of the present invention. This diagram is merely an illustration and should not unduly limit the scope of the claims herein. One of ordinary skill in the art would recognize other variations, modifications, and alternatives. In a specific embodiment, the present invention provides a packaged light emitting device 600. As shown, the device has a substrate member comprising a surface region. In a specific embodiment, the substrate is made of a suitable material such a metal including, but not limited to, Alloy 42, copper, or others, including dielectrics and even plastics. In a specific embodiment, the substrate is generally from a lead frame member such as metal alloy, but can be others.

In a specific embodiment, the present substrate, which holds the LED, can come in various shapes, sizes, and configurations. In a specific embodiment, the surface region of substrate 601 is cupped. Alternatively, the surface region 601 is recessed according to a specific embodiment. Additionally, the surface region is generally a smooth surface, plating, or coating. Such plating or coating can be gold, silver, platinum, aluminum, or any pure or alloy material, which is suitable for bonding to an overlying semiconductor material, but can be others. Of course, there can be other variations, modifications, and alternatives.

Referring again to FIG. 6, the device has one or more light emitting diode devices overlying the surface region. At least one of the light emitting diode devices 103 is fabricated on a semipolar or nonpolar GaN containing substrate. In a specific embodiment, the device emits polarized electromagnetic radiation. As shown, the light emitting device is coupled to a first potential, which is attached to the substrate, and a second potential 610, which is coupled to wire or lead 611 bonded to a light emitting diode. Of course, there can be other variations, modifications, and alternatives.

In a specific embodiment, the device has at least one of the light emitting diode devices comprising a quantum well region. In a specific embodiment, the quantum well region is characterized by an electron wave function and a hole wave function. The electron wave function and the hole wave function are substantially overlapped within a predetermined spatial region of the quantum well region according to a specific embodiment. Of course, there can be other variations, modifications, and alternatives.

In a preferred embodiment, the one or more light emitting diode device comprises at least a blue LED device. In a specific embodiment, the substantially polarized emission is blue light. The one or more light emitting diode device comprises at least a blue LED device capable of emitting electromagnetic radiation at a range from about 430 nanometers to about 490 nanometers, which is substantially polarized emission being blue light.

In a specific embodiment, the present device also has a thickness 115 of one or more entities formed overlying the one or more light emitting diode devices. In a specific embodiment, the one or more entities are excited by the substantially polarized emission and emit electromagnetic radiation of one or more second wavelengths. In a preferred embodiment, the plurality of entities is capable of emitting substantially yellow light from an interaction with the substantially polarized emission of blue light. In a specific embodiment, the thickness of the plurality of entities, which are phosphor entities, is about five microns and less. Of course, there can be other variations, modifications, and alternatives.

In a specific embodiment, the one or more entities comprises a phosphor or phosphor blend selected from one or more of $(Y,Gd,Tb,Sc,Lu,La)_3(Al,Ga,In)_5O_{12}:Ce^{3+}$, $SrGa_2S_4:Eu^{2+}$, $SrS:Eu^{2+}$, and colloidal quantum dot thin films comprising CdTe, ZnS, ZnSe, ZnTe, CdSe, or CdTe. In other embodiments, the device may include a phosphor capable of emitting substantially red light. Such phosphor is be selected from $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $Y_2(O,S)_3:Eu^{3+}$; $Ca_{1-x}Mo_{1-y}Si_yO_4$; where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn_4+$ (MFG); $(Ba,Sr,Ca)Mg_xP_2O_7:Eu^{2+}$, $Mn^{2+}$; $(Y,Lu)_2WO_6:Eu^{3+}$, $Mo^{6+}$; $(Ba,Sr,Ca)_3Mg_xSi_2O_8:Eu^{2+}$, $Mn^{2+}$, wherein $1 \leq x \leq 2$; $(RE_{1-y}Ce_y)Mg_{2-x}Li_xSi_{3-x}P_xO_{12}$, where RE is at least one of Sc, Lu, Gd, Y, and Tb, $0.0001 < x < 0.1$ and $0.001 < y < 0.1$; $(Y,Gd,Lu,La)_{2-x}Eu_xW_{1-y}Mo_yO_6$, where $0.5 \leq x \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$ wherein M is selected from the group of Sc, Y, a lanthanide, an alkali earth metal and mixtures thereof, X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof. Of course, there can be other variations, modifications, and alternatives.

In a specific embodiment, the one or more light emitting diode device comprises at least a violet LED device capable of emitting electromagnetic radiation at a range from about 380 nanometers to about 440 nanometers and the one or more entities are capable of emitting substantially white light, the substantially polarized emission being violet light. Other colored LEDs may also be used or combined according to a specific embodiment. Of course, there can be other variations, modifications, and alternatives.

In a specific embodiment, the one or more entities comprise a blend of phosphors capable of emitting substantially blue light, substantially green light, and substantially red light. As an example, the blue emitting phosphor is selected from the group consisting of $(Ba,Sr,Ca)_5(PO_4)_3(Cl,F,Br,OH):Eu^{2+}$, $Mn^{2+}$; $Sb^{3+}$,$(Ba,Sr,Ca)MgAl_{10}O_{17}:Eu^{2+}$, $Mn^{2+}$; $(Ba,Sr,Ca)BPO_5:Eu^{2+}$, $Mn^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_8*2SrCl_2:Eu^{2+}$; $(Ba,Sr,Ca)Mg_xP_2O_7:Eu^{2+}$, $Mn^{2+}$; $Sr_4Al_{14}O_{25}:Eu^{2+}$ (SAE); $BaAl_8O_{13}:Eu^{2+}$; and mixtures thereof. As an example, the green phosphor is selected from the group consisting of $(Ba,Sr,Ca)MgAl_{10}O_{17}:Eu^{2+}$, $Mn^{2+}$ (BAMn); $(Ba,Sr,Ca)Al_2O_4:Eu^{2+}$; $(Y,Gd,Lu,Sc,La)BO_3:Ce^{3+},Tb^{3+}$; $Ca_8Mg(SiO_4)_4C_{12}:Eu^{2+}$, $Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4Cl_2:Eu^{2+}$, $Mn^{2+}$ (CASI); $Na_2Gd_2B_2O_7:Ce^{3+}$, $Tb^{3+}$; $(Ba,Sr)_2(Ca,Mg,Zn)B_2O_6:K,Ce,Tb$; and mixtures thereof. As an example, the red phosphor is selected from the group consisting of $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $Y_2(O,S)_3:Eu^{3+}$; $Ca_{1-x}Mo_{1-y}Si_yO_4$: where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2-}$, $Mn^{2+}$; $(Y,Lu)_2WO_6:Eu^{3+}$, $Mo^{6+}$; $(Ba,Sr,Ca)_3Mg_xSi_2O_8:Eu^{2+}$, $Mn^{2+}$, wherein $1 < x \leq 2$; $(RE_{1-y}Ce_y)Mg_{2-x}Li_xSi_{3-x}P_xO_{12}$, where RE is at least one of Sc, Lu, Gd, Y, and Tb, $0.0001 < x < 0.1$ and $0.001 < y < 0.1$; $(Y,Gd,Lu,La)_{2-x}Eu_xW_{1-y}Mo_yO_6$, where $0.5 \leq x \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$, wherein M is selected from the group of Sc, Y, a lanthanide, an alkali earth metal and mixtures thereof, X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof.

In a specific embodiment, the present packaged device includes a second LED device 603 or possibly multiple devices. As shown, the second LED device is coupled to a first potential, which is attached to the substrate, and a second potential 609, which is coupled to wire or lead 111 bonded to the second LED device. In a specific embodiment, the second LED device can be coated with a phosphor or uncoated 615. In a specific embodiment, the LED device can be one of a plurality of colors including, but not limited to red, blue, green, yellow, violet, amber, cyan, and others within a visible electromagnetic radiation range, including ultraviolet. In a specific embodiment, the LED device can be made on a polar, non-polar, or semi-polar gallium nitride containing material. Alternatively, the LED can be made on an AlInGaP or like material according to other embodiments. Of course, there can be other variations, modifications, and alternatives.

In other embodiments, the packaged device can include one or more other types of optical and/or electronic devices. As an example, the optical devices can be an organic light emitting diode (OLED), a laser diode, a nanoparticle optical device, or others. In other embodiments, the electronic device can include an integrated circuit, a transistor, a rectifier, a sensor, a micro-machined electronic mechanical system, or any combination of these, and the like. Of course, there can be other variations, modifications, and alternatives.

In a specific embodiment, the present packaged device includes an enclosure 617. The enclosure can be made of a suitable material such as an optically transparent plastic, glass, or other material. As also shown, the enclosure has a suitable shape 619 according to a specific embodiment. The shape can be annular, circular, egg-shaped, trapezoidal, or any combination of these. Depending upon the embodiment, the enclosure with suitable shape and material is configured to facilitate and even optimize transmission of electromagnetic radiation from the LED device with coating through the surface region of the enclosure. Of course, there can be other variations, modifications, and alternatives.

FIGS. 7 through 10 illustrate a simplified method of assembling the light emitting device of FIG. 6 according to an embodiment of the present invention. Of course, there can be other variations, modifications, and alternatives.

FIG. 11 is a simplified diagram of yet an alternative packaged light emitting device using an optical path to a plane region according to an embodiment of the present invention. This diagram is merely an illustration and should not unduly limit the scope of the claims herein. One of ordinary skill in the art would recognize other variations, modifications, and alternatives. In a specific embodiment, the present invention provides a packaged light emitting device 1100. As shown, the device has a substrate member comprising a surface region. In a specific embodiment, the substrate is made of a suitable material such a metal including, but not limited to, Alloy 42, copper, dielectrics or plastics, among others. In a specific embodiment, the substrate is generally from a lead frame member such as a metal alloy, but can be others.

In a specific embodiment, the present substrate, which holds the LED, can come in various shapes, sizes, and configurations. In a specific embodiment, the surface region of substrate 1101 is cupped. Alternatively, the surface region 1101 is recessed according to a specific embodiment. Additionally, the surface region is generally a smooth surface, plating, or coating. Such plating or coating can be gold, silver, platinum, aluminum, or any pure or alloy material, which is suitable for bonding to an overlying semiconductor material, but can be others. Of course, there can be other variations, modifications, and alternatives.

Referring again to FIG. 11, the device has one or more light emitting diode devices overlying the surface region. At least one of the light emitting diode devices 1103 is fabricated on a semipolar or nonpolar GaN containing substrate. In a specific embodiment, the device emits polarized electromagnetic radiation 1105. As shown, the light emitting device is coupled to a first potential, which is attached to the substrate, and a second potential 1109, which is coupled to wire or lead 1111 bonded to a light emitting diode. Of course, there can be other variations, modifications, and alternatives.

In a specific embodiment, the device has at least one of the light emitting diode devices comprising a quantum well region. In a specific embodiment, the quantum well region is characterized by an electron wave function and a hole wave function. The electron wave function and the hole wave function are substantially overlapped within a predetermined spatial region of the quantum well region according to a specific embodiment. Of course, there can be other variations, modifications, and alternatives.

In a preferred embodiment, the one or more light emitting diode device comprises at least a blue LED device. In a specific embodiment, the substantially polarized emission is blue light. The one or more light emitting diode device comprises at least a blue LED device capable of emitting electromagnetic radiation at a range from about 430 nanometers to about 490 nanometers, which is substantially polarized emission being blue light.

In a specific embodiment, the present packaged device includes an enclosure 1117. The enclosure can be made of a suitable material such as an optically transparent plastic, glass, or other material. As also shown, the enclosure has a suitable shape 1119 according to a specific embodiment. The shape can be annular, circular, egg-shaped, trapezoidal, or any combination of these. Depending upon the embodiment, the enclosure with suitable shape and material is configured to facilitate and even optimize transmission of electromagnetic radiation from the LED device through the surface region of the enclosure. In a specific embodiment, the enclosure comprises an interior region and an exterior region with a volume defined within the interior region. The volume is open and filled with an inert gas or air to provide an optical path between the LED device or devices and the surface region of the enclosure. In a specific embodiment, the enclosure also has a thickness and fits around a base region of the substrate. Of course, there can be other variations, modifications, and alternatives.

In a specific embodiment, the present packaged device also has a thickness 1115 of one or more entities formed overlying the enclosure to interact with light from the one or more light emitting diode devices. In a specific embodiment, the one or more entities are excited by the substantially polarized emission and emit electromagnetic radiation of one or more second wavelengths. In a preferred embodiment, the plurality of entities is capable of emitting substantially yellow light from an interaction with the substantially polarized emission of blue light. In a specific embodiment, the thickness of the plurality of entities, which are phosphor entities, is about five microns and less. Of course, there can be other variations, modifications, and alternatives.

In a specific embodiment, the one or more entities comprises a phosphor or phosphor blend selected from one or more of $(Y,Gd,Tb,Sc,Lu,La)_3(Al,Ga,In)_5O_{12}:Ce^{3+}$, $SrGa_2S_4:Eu^{2+}$, $SrS:Eu^{2+}$, and colloidal quantum dot thin films comprising CdTe, ZnS, ZnSe, ZnTe, CdSe, or CdTe. In other embodiments, the device may include a phosphor capable of emitting substantially red light. Such phosphor is be selected from $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $Y_2(O,S)_3:Eu^{3+}$; $Ca_{1-x}Mo_{1-y}Si_yO_4$: where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2-}$, $Mn^{2+}$; $(Y,Lu)_2WO_6:Eu^{3+}$, $Mo^{6+}$; $(Ba,Sr,Ca)_3Mg_xSi_2O_8:Eu^{2+}$, $Mn^{2+}$, wherein $1<x\leq2$; $(RE_{1-y}Ce_y)Mg_{2-x}Li_xSi_{3-x}P_xO_{12}$, where RE is at least one of Sc, Lu, Gd, Y, and Tb, $0.0001<x<0.1$ and $0.001<y<0.1$; $(Y,Gd,Lu,La)_{2-x}Eu_xW_{1-y}Mo_yO_6$, where $0.5 \leq x. \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$ wherein M is selected from the group of Sc, Y, a lanthanide, an alkali earth metal and mixtures thereof, X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof. Of course, there can be other variations, modifications, and alternatives.

In a specific embodiment, the one or more light emitting diode device comprises at least a violet LED device capable of emitting electromagnetic radiation at a range from about 380 nanometers to about 440 nanometers and the one or more entities are capable of emitting substantially white light, the substantially polarized emission being violet light. Other colored LEDs may also be used or combined according to a specific embodiment. Of course, there can be other variations, modifications, and alternatives.

In a specific embodiment, the one or more entities comprise a blend of phosphors capable of emitting substantially blue light, substantially green light, and substantially red light. As an example, the blue emitting phosphor is selected from the group consisting of $(Ba,Sr,Ca)_5(PO_4)_3(Cl,F,Br,OH)$:$Eu^{2+}$, $Mn^{2+}$; $Sb^{3+}$,$(Ba,Sr,Ca)MgAl_{10}O_{17}$:$Eu^{2+}$, $Mn^{2+}$; $(Ba,Sr,Ca)BPO_5$:$Eu^{2+}$, $Mn^{2+}$; $(Sr,Ca)_{10}(PO_4)_6*nB_2O_3$:$Eu^{2+}$; $2SrO*0.84P_2O_5*0.16B_2O_3$:$Eu^{2+}$; $Sr_2Si_3O_8*2SrCl_2$:$Eu^{2+}$; $(Ba,Sr,Ca)Mg_xP_2O_7$:$Eu^{2+}$, $Mn^{2+}$; $Sr_4Al_{14}O_{25}$:$Eu^{2+}$ (SAE); $BaAl_8O_{13}$:$Eu^{2+}$; and mixtures thereof. As an example, the green phosphor is selected from the group consisting of $(Ba,Sr,Ca)MgAl_{10}O_{17}$:$Eu^{2+}$, $Mn^{2+}$ (BAMn); $(Ba,Sr,Ca)Al_2O_4$:$Eu^{2+}$; $(Y,Gd,Lu,Sc,La)BO_3$:$Ce^{3+}$, $Tb^{3+}$; $Ca_8Mg(SiO_4)_4Cl_2$:$Eu^{2+}$, $Mn^{2+}$; $(Ba,Sr,Ca)_2SiO_4$:$Eu^{2+}$; $(Ba,Sr,Ca)_2(Mg,Zn)Si_2O_7$:$Eu^{2+}$; $(Sr,Ca,Ba)(Al,Ga,In)_2S_4$:$Eu^{2+}$; $(Y,Gd,Tb,La,Sm,Pr,Lu)_3(Al,Ga)_5O_{12}$:$Ce^{3+}$; $(Ca,Sr)_8(Mg,Zn)(SiO_4)_4Cl_2$:$Eu^{2+}$, $Mn^{2+}$ (CASI); $Na_2Gd_2B_2O_7$:$Ce^{3+}$, $Tb^{3+}$; $(Ba,Sr)_2(Ca,Mg,Zn)B_2O_6$:$K,Ce,Tb$; and mixtures thereof. As an example, the red phosphor is selected from the group consisting of $(Gd,Y,Lu,La)_2O_3$:$Eu^{3+}$, $Bi^{3+}$; $(Gd,Y,Lu,La)_2O_2S$:$Eu^{3+}$, $Bi^{3+}$; $(Gd,Y,Lu,La)VO_4$:$Eu^{3+}$, $Bi^{3+}$; $Y_2(O,S)_3$:$Eu^{3+}$; $Ca_{1-x}Mo_{1-y}Si_yO_4$; where $0.05 \leq x \leq 0.5$, $0 \leq y \leq 0.1$; $(Li,Na,K)_5Eu(W,Mo)O_4$; $(Ca,Sr)S$:$Eu^{2+}$; $SrY_2S_4$:$Eu^{2+}$; $CaLa_2S_4$:$Ce^{3+}$; $(Ca,Sr)S$:$Eu^{2+}$; $3.5MgO*0.5MgF_2*GeO_2$:$Mn^{4+}$ (MFG); $(Ba,Sr,Ca)Mg_xP_2O_7$:$Eu^{2-}$, $Mn^{2+}$; $(Y,Lu)_2WO_6$:$Eu^{3+}$, $Mo^{6+}$; $(Ba,Sr,Ca)_3Mg_xSi_2O_8$:$Eu^{2+}$, $Mn^{2+}$, wherein $1 < x \leq 2$; $(RE_{1-y}Ce_y)Mg_{2-x}Li_xSi_{3-x}P_xO_{12}$, where RE is the least one of Sc, Lu, Gd, Y, and Tb, $0.0001 < x < 0.1$ and $0.001 < y < 0.1$; $(Y,Gd,Lu,La)_2$-$Eu_xW_{1-y}Mo_yO_6$, where $0.5 \leq x. \leq 1.0$, $0.01 \leq y \leq 1.0$; $(SrCa)_{1-x}Eu_xSi_5N_8$, where $0.01 \leq x \leq 0.3$; $SrZnO_2$:$Sm^{+3}$; $M_mO_nX$, wherein M is selected from the group of Sc, Y, a lanthanide, an alkali earth metal and mixtures thereof, X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof.

FIGS. 12 through 15 illustrate a simplified method of assembling the light emitting device of FIG. 11 according to an embodiment of the present invention.

FIG. 16 is a simplified diagram of a yet an alternative packaged light emitting device 1600 using an optical path to a plane region and filler material according to an embodiment of the present invention. This diagram is merely an illustration and should not unduly limit the scope of the claims herein. One of ordinary skill in the art would recognize other variations, modifications, and alternatives. In a specific embodiment, the present invention provides a packaged light emitting device 1600. As shown, the device has a substrate member comprising a surface region. In a specific embodiment, the substrate is made of a suitable material such a metal including, but not limited to, Alloy 42, copper, dielectric, or even plastic, among others. In a specific embodiment, the substrate is generally from a lead frame member such as a metal alloy, but can be others.

In a specific embodiment, the present substrate, which holds the LED, can come in various shapes, sizes, and configurations. In a specific embodiment, the surface region of substrate 1601 is cupped. Alternatively, the surface region 1601 is recessed according to a specific embodiment. Additionally, the surface region is generally smooth surface and plating or coating. Such plating or coating can be gold, silver, platinum, or any pure or alloy material, which is suitable for bonding to an overlying semiconductor material, but can be others. Of course, there can be other variations, modifications, and alternatives.

Referring again to FIG. 1, the device has one or more light emitting diode devices overlying the surface region. Each of the light emitting diode device 1603 is fabricated on a semipolar or nonpolar GaN containing substrate. In a specific embodiment, the device emits polarized electromagnetic radiation. As shown, the light emitting device is coupled to a first potential, which is attached to the substrate, and a second potential 1609, which is coupled to wire or lead 1611 bonded to a light emitting diode. Of course, there can be other variations, modifications, and alternatives.

In a specific embodiment, the device has at least one of the light emitting diode devices comprising a quantum well region. In a specific embodiment, the quantum well region is characterized by an electron wave function and a hole wave function. The electron wave function and the hole wave function are substantially overlapped within a predetermined spatial region of the quantum well region according to a specific embodiment. Of course, there can be other variations, modifications, and alternatives.

In a preferred embodiment, the one or more light emitting diode device comprises at least a blue LED device. In a specific embodiment, the substantially polarized emission is blue light. The one or more light emitting diode device comprises at least a blue LED device capable of emitting electromagnetic radiation at a range from about 480 nanometers to about 570 nanometers, which is substantially polarized emission being blue light.

In a specific embodiment, the present device also has a thickness 1615 of one or more entities formed overlying the one or more light emitting diode devices and within an interior region of enclosure 1617, which will be described in more detail below. In a specific embodiment, the one or more entities are excited by the substantially polarized emission and emit electromagnetic radiation of one or more second wavelengths. In a preferred embodiment, the plurality of entities is capable of emitting substantially yellow light from an interaction with the substantially polarized emission of blue light. In a specific embodiment, the thickness of the plurality of entities, which are phosphor entities, is about five microns and less. Of course, there can be other variations, modifications, and alternatives.

In a specific embodiment, the one or more entities comprises a phosphor or phosphor blend selected from one or more of $(Y,Gd,Tb,Sc,Lu,La)_3(Al,Ga,In)_5O_{12}$:$Ce^{3+}$, $SrGa_2S_4$:$Eu^{2+}$, $SrS$:$Eu^{2+}$, and colloidal quantum dot thin films comprising CdTe, ZnS, ZnSe, ZnTe, CdSe, or CdTe. In other embodiments, the device may include a phosphor capable of emitting substantially red light. Such phosphor is be selected from $(Gd,Y,Lu,La)_2O_3$:$Eu^{3+}$, $Bi^{3+}$; $(Gd,Y,Lu,La)_2O_2S$:$Eu^{3+}$, $Bi^{3+}$; $(Gd,Y,Lu,La)VO_4$:$Eu^{3+}$, $Bi^{3+}$; $Y_2(O,S)_3$:$Eu^{3+}$; $Ca_{1-x}Mo_{1-y}Si_yO_4$: where $0.05 \leq x \leq 0.5$, $0 \leq y \leq 0.1$; $(Li,Na,K)_5Eu(W,Mo)O_4$; $(Ca,Sr)S$:$Eu^{2+}$; $SrY_2S_4$:$Eu^{2+}$; $CaLa_2S_4$:$Ce^{3+}$; $(Ca,Sr)S$ $Eu^{2+}$; $3.5MgO*0.5MgF_2*GeO_2$:$Mn^{4+}$ (MFG); $(Ba,Sr,Ca)Mg_xP_2O_7$:$Eu^{2-}$, $Mn^{2+}$; $(Y,Lu)_2WO_6$:$Eu^{3+}$, $Mo^{6+}$; $(Ba,Sr,Ca)_3Mg_xSi_2O_8$:$Eu^{2+}$, $Mn^{2+}$, wherein $1 < x \leq 2$; $(RE_{1-y}Ce_y)Mg_{2-x}Li_xSi_{3-x}P_xO_{12}$, where RE is at least one of Sc, Lu, Gd, Y, and Tb, $0.0001<x<0.1$ and $0.001<y<0.1$; $(Y,Gd,Lu,La)_{2-x}Eu_xW_{1-y}Mo_yO_6$, where $0.5 \leq x. \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$ wherein M is selected from the group of Sc, Y, a lanthanide, an alkali earth metal and mixtures thereof, X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof. Of course, there can be other variations, modifications, and alternatives.

In a specific embodiment, the one or more light emitting diode device comprises at least a violet LED device capable of emitting electromagnetic radiation at a range from about 380 nanometers to about 440 nanometers and the one or more entities are capable of emitting substantially white light, the substantially polarized emission being violet light. Other colored LEDs may also be used or combined according to a specific embodiment. Of course, there can be other variations, modifications, and alternatives.

In a specific embodiment, the one or more entities comprise a blend of phosphors capable of emitting substantially blue light, substantially green light, and substantially red light. As an example, the blue emitting phosphor is selected from the group consisting of $(Ba,Sr,Ca)_5(PO_4)_3(Cl,F,Br,OH):Eu^{2+}$, $Mn^{2+}$; $Sb^{3+}$,$(Ba,Sr,Ca)MgAl_{10}O_{17}:Eu^{2+}$, $Mn^{2+}$; $(Ba,Sr,Ca)BPO_5:Eu^{2+}$, $Mn^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_8*2SrCl_2:Eu^{2+}$; $(Ba,Sr,Ca)Mg_xP_2O_7:Eu^{2+}$, $Mn^{2+}$; $Sr4Al_{14}O_{25}:Eu^{2+}$ (SAE); $BaAl_8O_{13}:Eu^{2+}$; and mixtures thereof. As an example, the green phosphor is selected from the group consisting of $(Ba,Sr,Ca)MgAl_{10}O_{17}:Eu^{2+}$, $Mn^{2+}$ (BAMn); $(Ba,Sr,Ca)Al_2O_4:Eu^{2+}$; $(Y,Gd,Lu,Sc,La)BO_3:Ce^{3+},Tb^{3+}$; $Ca_8Mg(SiO_4)_4Cl_2:Eu^{2+}$, $Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4Cl_2:Eu^{2+}$, $Mn^{2+}$ (CASI); $Na_2Gd_2B_2O_7:Ce^{3+}$, $Tb^{3+}$; $(Ba,Sr)_2(Ca,Mg,Zn)B_2O_6:K,Ce,Tb$; and mixtures thereof. As an example, the red phosphor is selected from the group consisting of $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $Y_2(O,S)_3:Eu^{3+}$; $Ca_{1-x}Mo_{1-y}Si_yO_4$; where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+}$, $Mn^{2+}$; $(Y,Lu)_2WO_6:Eu^{3+}$, $Mo^{6+}$; $(Ba,Sr,Ca)_3Mg_xSi_2O_8:Eu^{2+}$, $Mn^{2+}$, wherein $1<x \leq 2$; $(RE_{1-y}Ce_y)Mg_{2-x}Li_xSi_{3-x}P_xO_{12}$, where RE is at least one of Sc, Lu, Gd, Y, and Tb, $0.0001<x<0.1$ and $0.001<y<0.1$; $(Y,Gd,Lu,La)_{2-x}Eu_xW_{1-y}Mo_yO_6$, where $0.5 \leq x. \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$, wherein M is selected from the group of Sc, Y, a lanthanide, an alkali earth metal and mixtures thereof, X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof.

In a specific embodiment, the present packaged device includes an enclosure 1617. The enclosure can be made of a suitable material such as an optically transparent plastic, glass, or other material. As also shown, the enclosure has a suitable shape 1619 according to a specific embodiment. The shape can be annular, circular, egg-shaped, trapezoidal, or any combination of these shapes. Depending upon the embodiment, the enclosure with suitable shape and material is configured to facilitate and even optimize transmission of electromagnetic radiation from the LED device through the surface region of the enclosure. In a specific embodiment, the enclosure comprises an interior region and an exterior region with a volume defined within the interior region. The volume is open and filled with an inert gas or air to provide an optical path between the LED device or devices and the surface region of the enclosure. In a specific embodiment, the enclosure also has a thickness and fits around a base region of the substrate. Of course, there can be other variations, modifications, and alternatives.

In a specific embodiment, the plurality of entities is suspended in a suitable medium. An example of such a medium can be a silicone, glass, spin on glass, plastic, polymer, which is doped, metal, or semiconductor material, including layered materials, and/or composites, among others. Depending upon the embodiment, the medium including polymers begins as a fluidic state, which fills an interior region of the enclosure. In a specific embodiment, the medium fills and can seal the LED device or devices. The medium is then cured and fills in a substantially stable state according to a specific embodiment. The medium is preferably optically transparent or can also be selectively transparent and/or translucent according to a specific embodiment. In addition, the medium, once cured, is substantially inert according to a specific embodiment. In a preferred embodiment, the medium has a low absorption capability to allow a substantial portion of the electromagnetic radiation generated by the LED device to traverse through the medium and be outputted through the enclosure. In other embodiments, the medium can be doped or treated to selectively filter, disperse, or influence one or more selected wavelengths of light. As an example, the medium can be treated with metals, metal oxides, dielectrics, or semiconductor materials, and/or combinations of these materials, and the like. Of course, there can be other variations, modifications, and alternatives.

FIGS. 17 through 20 illustrate a simplified method of assembling the light emitting device of FIG. 16 according to an embodiment of the present invention.

Figure 21:
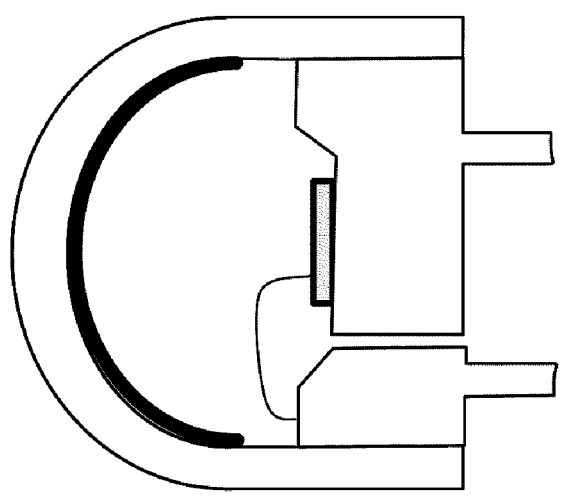
FIG. 21 is a simplified diagram of a yet an alternative packaged light emitting device using an optical path to a plane region according to an embodiment of the present invention.

FIG. 21 is a simplified diagram of a yet an alternative packaged light emitting device using an optical path to a plane region according to an embodiment of the present invention. As shown, the packaged light emitting device includes one or more entities formed within an interior region of enclosure 2117. As shown, the one or more entities can be deposited within the interior region facing the light emitting diode devices.

Figure 22:
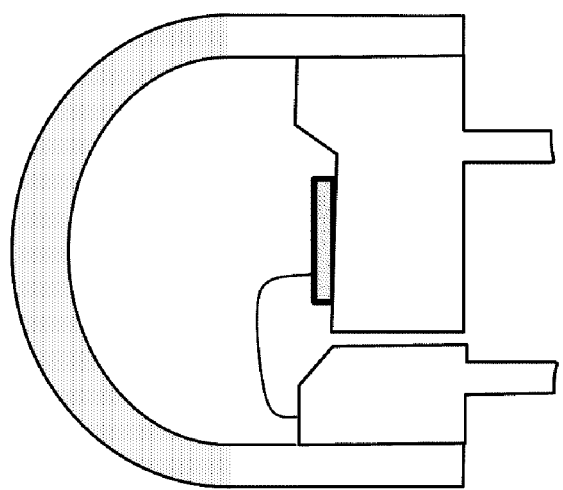
FIG. 22 is a simplified diagram of a yet an alternative packaged light emitting device using an optical path to a plane region according to an embodiment of the present invention.

FIG. 22 is a simplified diagram of a yet an alternative packaged light emitting device using an optical path to a plane region according to an embodiment of the present invention. As shown, the packaged light emitting device includes one or more entities formed within a thickness of enclosure 2217. As shown, the one or more entities can be formed within a thickness and formed within the enclosure according to a specific embodiment.

Although the above has been described in terms of an embodiment of a specific package, there can be many variations, alternatives, and modifications. As an example, the LED device can be configured in a variety of packages such as cylindrical, surface mount, power, lamp, flip-chip, star, array, strip, or geometries that rely on lenses (silicone, glass) or sub-mounts (ceramic, silicon, metal, composite). Alternatively, the package can be any variations of these packages. Of course, there can be other variations, modifications, and alternatives.

In other embodiments, the packaged device can include one or more other types of optical and/or electronic devices. As an example, the optical devices can be OLED, a laser, a nanoparticle optical device, and others. In other embodiments, the electronic device can include an integrated circuit, a sensor, a micro-machined electronic mechanical system, or any combination of these, and the like. Of course, there can be other variations, modifications, and alternatives.

In a specific embodiment, the packaged device can be coupled to a rectifier to convert alternating current power to direct current, which is suitable for the packaged device. The rectifier can be coupled to a suitable base, such as an Edison screw such as E27 or E14, bipin base such as MR16 or GU5.3, or a bayonet mount such as GU10, or others. In other embodiments, the rectifier can be spatially separated from the packaged device. Of course, there can be other variations, modifications, and alternatives.

Additionally, the present packaged device can be provided in a variety of applications. In a preferred embodiment, the application is general lighting, which includes buildings for offices, housing, outdoor lighting, stadium lighting, and others. Alternatively, the applications can be for display, such as those used for computing applications, televisions, flat panels, micro-displays, and others. Still further, the applications can include automotive, gaming, and others. Of course, there can be other variations, modifications, and alternatives.

In a specific embodiment, the present devices are configured to achieve spatial uniformity. That is, diffusers can be added to the encapsulant to achieve spatial uniformity. Depending upon the embodiment, the diffusers can include $TiO_2$, $CaF_2$, $SiO_2$, $CaCO_3$, $BaSO_4$, and others, which are optically transparent and have a different index than the encapsulant causing the light to reflect, refract, and scatter to make the far field pattern more uniform. Of course, there can be other variations, modifications, and alternatives.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero). Of course, there can be other variations, modifications, and alternatives.

While the above is a full description of the specific embodiments, various modifications, alternative constructions and equivalents may be used. As an example, the packaged device can include any combination of elements described above, as well as outside of the present specification. Additionally, the above has been generally described in terms of one or more entities that may be one or more phosphor materials or phosphor like materials, but it would be recognized that other "energy-converting luminescent materials," which may include one or more phosphors, semiconductors, semiconductor nanoparticles ("quantum dots"), organic luminescent materials, and the like, and combinations of them, can also be used. In one or more preferred embodiments, the energy converting luminescent materials can generally be one or more wavelength converting material and/or materials or thicknesses of them. Furthermore, the above has been generally described in electromagnetic radiation that directly emits and interacts with the wavelength conversion materials, but it would be recognized that the electromagnetic radiation can be reflected and then interacts with the wavelength conversion materials or a combination of reflection and direct incident radiation. In other embodiments, the present specification describes one or more specific gallium and nitrogen containing surface orientations, but it would be recognized that any one of a plurality of family of plane orientations can be used. Of course, there can be other variations, modifications, and alternatives. Therefore, the above description and illustrations should not be taken as limiting the scope of the present invention which is defined by the appended claims.

What is claimed is:

1. A light emitting device comprising:
   a substrate member comprising a surface region;
   one or more light emitting diode devices overlying the surface region, at least one of the light emitting diode devices being fabricated on a semipolar or nonpolar GaN containing substrate, the at least one or more light emitting diode devices fabricated on the semipolar or nonpolar GaN containing substrate emitting substantially polarized emission of one or more first wavelengths;
   an optically transparent member coupled to the one or more light emitting diode devices;
   an optical path provided between the one or more light emitting diode devices and the optically transparent member;
   a thickness of one or more entities formed within a vicinity of the optically transparent member, one or more of the entities being excited by the substantially polarized emission to emit electromagnetic radiation at one or more second wavelengths;
   wherein the one or more light emitting diode device include a blue LED device capable of emitting electromagnetic radiation from about 430 nanometers to about 490 nanometers and the one or more entities is capable of emitting substantially yellow light, the substantially polarized emission being blue light; and
   wherein the one or more entities comprises a phosphor or phosphor blend selected from at least one of $(Y,Gd,Tb,Sc,Lu,La)_3(Al,Ga,In)_5O_{12}:Ce^{3+}$, $SrGa_2S_4:Eu^{2+}$, $SrS:Eu^{2+}$, and colloidal quantum dot thin films comprising CdTe, ZnS, ZnSe, ZnTe, CdSe, or CdTe.

2. The device of claim 1 wherein the thickness of the one or more entities is formed overlying a first side of the optically transparent member, the first side facing the one or more of the light emitting diode devices.

3. The device of claim 1 wherein the one or more light emitting diode device comprising at least a blue LED device, the substantially polarized emission being blue light.

4. The device of claim 1 wherein the one or more light emitting diode device comprises at least a blue LED device capable of emitting electromagnetic radiation at a wavelength range from about 430 nanometers to about 490 nanometers, the substantially polarized emission being blue light.

5. The device of claim 1 further comprising a phosphor capable of emitting substantially red light, wherein the phosphor is selected from one or more of the group consisting of $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $Y_2(O,S)_3:Eu^{3+}$; $Ca_{1-x}Mo_{1-y}Si_yO_4$, where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+}$, $Mn^{2+}$; $(Y,Lu)_2WO_6:Eu^{3+}$, $Mo^{6+}$; $(Ba,Sr,Ca)_3Mg_xSi_2O_8:Eu^{2+}$, $Mn^{2+}$, wherein $1<x \leq 2$; $(RE_{1-y}Ce_y)Mg_{2-x}Li_xSi_{3-x}PxO_{12}$, where RE is at least one of Sc, Lu, Gd, Y, and Tb, $0.0001<x<0.1$ and $0.001<y<0.1$; $(Y,Gd,Lu,La)_{2-x}Eu_xW_{1-y}Mo_yO_6$, where $0.5 \leq x \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$, wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof.

6. The device of claim 1 wherein the one or more light emitting diode device comprises at least a violet LED device capable of emitting electromagnetic radiation at a range from about 380 nanometers to about 440 nanometers and the one or more entities are capable of emitting substantially white light, the substantially polarized emission being violet light.

7. The device of claim 6 wherein the one or more entities comprises a blend of phosphors capable of emitting substantially blue light, substantially green light, and substantially red light.

8. The device of claim 7 wherein the blue emitting phosphor is selected from the group consisting of $(Ba,Sr,Ca)_5(PO_4)_3(Cl,F,Br,OH):Eu^{2+}$, $Mn^{2+}$; $Sb^{3+}$,$(Ba,Sr,Ca)MgAl_{10}O_{17}:Eu^{2+}$, $Mn^{2+}$; $(Ba,Sr,Ca)BPO_5:Eu^{2+}$, $Mn^{2+}$; $(Sr,Ca)_{10}(PO_4)_6*nB_2O_3:Eu^{2+}$; $2SrO*0.84P_2O5*0.16B_2O_3:Eu^{2+}$; $Sr_2Si_3O_8*2SrCl_2:Eu^{2+}$; $(Ba,Sr,Ca)Mg_xP_2O_7:Eu^{2+}$, $Mn^{2+}$; $Sr_4Al_{14}O_{25}:Eu^{2+}$ (SAE); $BaAl_8O_{13}:Eu^{2+}$; and mixtures thereof.

9. The device of claim 7 wherein the green phosphor is selected from the group consisting of $(Ba,Sr,Ca)MgAl_{10}O_{17}:Eu^{2+}$, $Mn^{2+}$ (BAMn); $(Ba,Sr,Ca)Al_2O_4:Eu^{2+}$; $(Y,Gd,Lu,Sc,La)BO_3:Ce^{3+},Tb^{3+}$; $Ca_8Mg(SiO_4)_4Cl_2:Eu^{2+}$, $Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4Cl_2:Eu^{2+}$, $Mn^{2+}$ (CASI); $Na_2Gd_2B_2O_7:Ce^{3+}$, $Tb^{3+}$; $(Ba,Sr)_2(Ca,Mg,Zn)B_2O_6:K,Ce,Tb$; and mixtures thereof.

10. The device of claim 7 wherein the red phosphor is selected from the group consisting of $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $Y_2(O,S)_3:Eu^{3+}$; $Ca_{1-x}Mo_{1-y}Si_yO_4$, where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+}$, $Mn^{2+}$; $(Y,Lu)_2WO_6:Eu^{3+}$, $Mo^{6+}$; $(Ba,Sr,Ca)_3Mg_xSi_2O_8:Eu^{2+}$, $Mn^{2+}$, wherein $1<x \leq 2$; $(RE_{1-y}Ce_y)Mg_{2-x}Li_xSi_{3-x}F_xO_{12}$, where RE is at least one of Sc, Lu, Gd, Y, and Tb, $0.0001 \leq x \leq 0.1$ and $0.001 < y < 0.1$; $(Y,Gd,Lu,La)_{2-x}Eu_xW_{1-y}Mo_yO_6$, where $0.5 \leq x. \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$, wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof.

11. The device of claim 1 wherein the one or more entities being a plurality of phosphor entities are selected from a red phosphor, a green phosphor, a blue phosphor, and a yellow phosphor.

12. The device of claim 1 wherein the thickness of the plurality of phosphor entities are provided by electrophoretic deposition, plating, sputtering, spraying, dipping, and dispensing.

13. The device of claim 1 wherein the one or more light emitting diode devices comprises two light emitting devices.

14. The device of claim 13 wherein the one of the light emitting devices emits blue light and the second emits yellow-green light.

15. The device of claim 14 wherein the blue LED device is capable of emitting electromagnetic radiation at a wavelength range from about 450 nanometers to about 495 nanometers and the yellow-green LED device is capable of emitting electromagnetic radiation at a wavelength range from about 495 nanometers to about 590 nanometers.

16. The device of claim 15 wherein the one or more entities is capable of emitting substantially red light at a wavelength range from about 620 nanometers to about 750 nanometers.

17. The device of claim 16 wherein the one or more entities comprises a red phosphor selected from one or more of the group consisting of $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $Y_2(O,S)_3:Eu^{3+}$; $Ca_{1-x}Mo_{1-y}Si_yO_4$, where $0.05 \leq x \leq 0.5$, $0 \leq y \leq 0.1$; $(Li,Na,K)_5Eu(W,Mo)O_4$; $(Ca,Sr)S:Eu^{2+}$; $SrY_2S_4:Eu^{2+}$; $CaLa_2S_4:Ce^{3+}$; $(Ca,Sr)S:Eu^{2+}$; $3.5MgO*0.5MgF_2*GeO_2:Mn^{4+}$ (MFG); $(Ba,Sr,Ca)Mg_xP_2O_7:Eu^{2+}$, $Mn^{2+}$; $(Y,Lu)_2WO_6:Eu^{3+}$, $Mo^{6+}$; $(Ba,Sr,Ca)_3Mg_xSi_2O_8:Eu^{2+}$, $Mn^{2+}$, wherein $1<x \leq 2$; $(RE_{1-y}Ce_y)Mg_{2-x}Li_xSi_{3-x}P_xO_{12}$, where RE is at least one of Sc, Lu, Gd, Y, and Tb, $0.0001 < x < 0.1$ and $0.001 < y < 0.1$; $(Y,Gd,Lu,La)_{2-x}Eu_xW_{1-y}Mo_yO_6$, where $0.5 \leq x. \leq 1.0$, $0.01 \leq y \leq 1.0$; $(SrCa)_{1-x}Eu_xSi_5N_8$, where $0.01 \leq x \leq 0.3$; $SrZnO_2:Sm^{+3}$; $M_mO_nX$, wherein M is selected from the group of Sc, Y, a lanthanide, an alkali earth metal and mixtures thereof; X is a halogen; $1 \leq m \leq 3$; and $1 \leq n \leq 4$, and wherein the lanthanide doping level can range from 0.1 to 40% spectral weight; and $Eu^{3+}$ activated phosphate or borate phosphors; and mixtures thereof.

18. A light emitting device comprising:
   a semipolar or nonpolar GaN containing substrate having a surface;
   at least one light emitting diode overlying the surface emitting a substantially polarized emission of first wavelengths;
   an optically transparent member coupled to the at least one light emitting diode;
   an optical path between the at least one light emitting diode and the optically transparent member; and
   a blend of phosphors capable of emitting substantially blue light, substantially green light, and substantially red light formed within a vicinity of the optically transparent member, the blend of phosphors being excited by the substantially polarized emission of first wavelengths to thereby emit electromagnetic radiation at second wavelengths.

19. The device of claim 18 wherein the at least one light emitting diode comprises at least one blue light emitting diode and the substantially polarized emission comprises blue light.

* * * * *